United States Patent [19]

Michon

[11] 3,786,263

[45] Jan. 15, 1974

[54] METHOD AND APPARATUS FOR SENSING RADIATION AND PROVIDING ELECTRICAL READOUT

[75] Inventor: Gerald J. Michon, Waterford, N.Y.

[73] Assignee: General Electric Company, Schenectady, N.Y.

[22] Filed: June 21, 1972

[21] Appl. No.: 264,803

[52] U.S. Cl. ............... 250/209, 178/7.2, 250/211 J, 250/220 M

[51] Int. Cl. ......................... H01j 39/12, H04n 5/38

[58] Field of Search .................... 250/211 J, 220 M, 250/209; 178/7.2

[56] References Cited

UNITED STATES PATENTS 3,562,425 2/1971 Poirier ............................ 250/211 J

*Primary Examiner*—James W. Lawrence
*Assistant Examiner*—T. N. Grigsby
*Attorney*—John F. Ahern et al.

[57] ABSTRACT

A substrate of semiconductor material of one conductivity type is provided with an insulating member overlying a surface of the substrate and a conducting member overlying the insulating member to form a surface charge storage cell. A capacitor is provided in circuit with a source of operating potentials between the conducting member and the substrate. Switching means in shunt with the capacitor connects the terminals of the capacitor together for one period of time and disconnects them for another period of time. The polarity and magnitude of the voltage applied to the storage cell is such as to produce depletion of majority carriers in a region in the surface adjacent portion of the substrate underlying the conducting member. Exposure of the substrate to radiation generates minority carriers therein which are stored near the surface of the depletion region. Circuit means are provided for changing the potential between the conducting member and the terminal of the capacitor remote from the substrate during the time the terminals of the capacitor are disconnected from one another to inject the stored minority carriers into the substrate whereby a displacement current flows in circuit between the substrate and the capacitor and produces a voltage across the capacitor which is proportional to the minority carriers stored in the depletion region during the time the terminals of the capacitor were connected. A plurality of storage cells such as described above are also provided on a common substrate and each of the cells are addressed in turn to effect injection of the charge stored therein into the substrate and produce respective voltages across a capacitor connected in circuit with the substrate. Means are provided for sampling the voltages developed across the capacitor in turn to provide an output having an amplitude varying with time in accordance with the variation in amplitude of the sample voltages.

25 Claims, 59 Drawing Figures

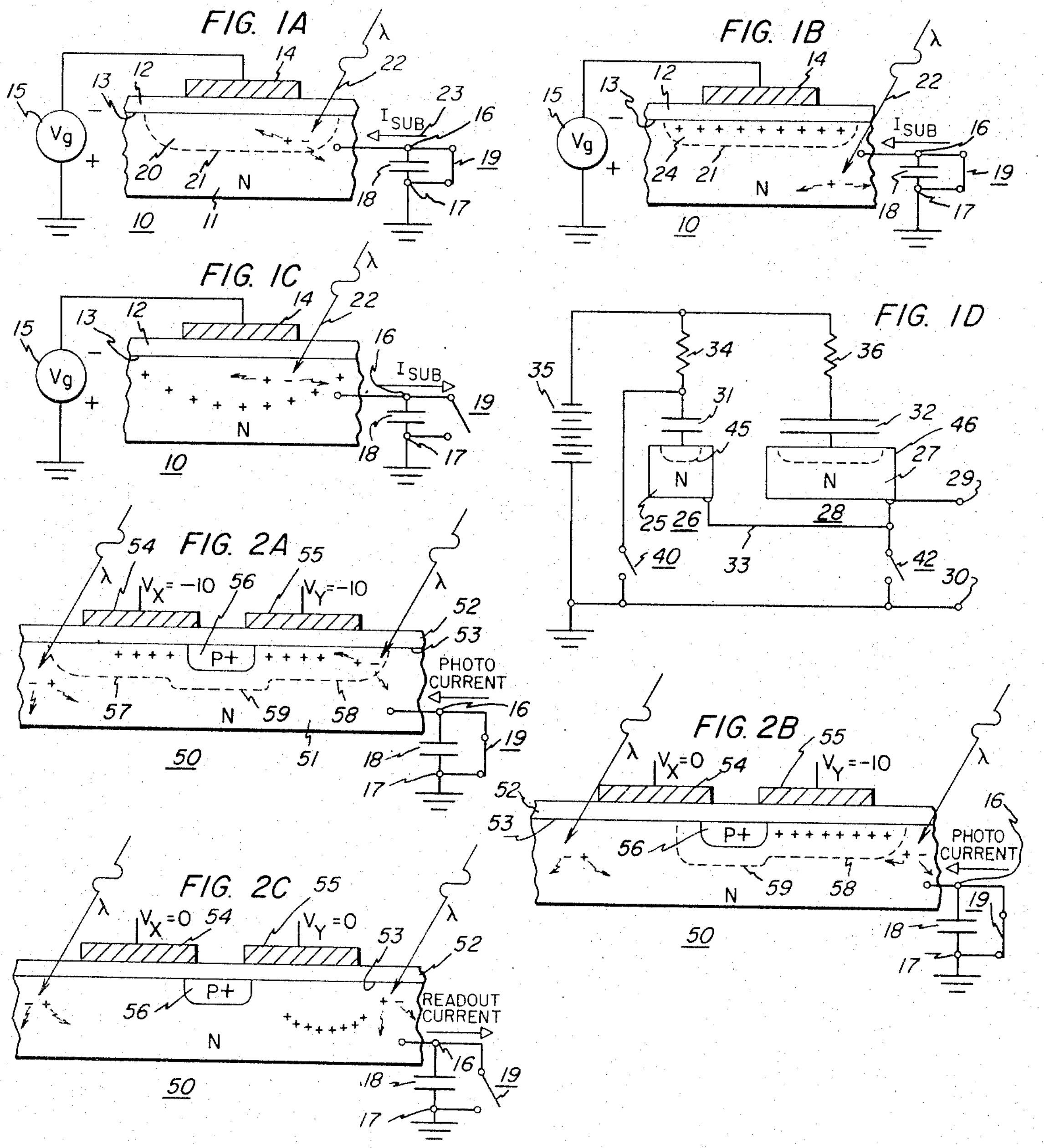
FIG. 1A, FIG. 1B, FIG. 1C, FIG. 1D, FIG. 2A, FIG. 2B, FIG. 2C
FIG. 3A
FIG. 3B
FIG. 3C
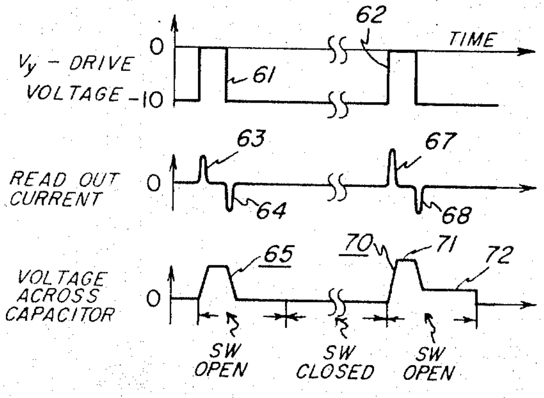

$V_X$ = ROW LINE VOLTAGE
$V_Y$ = COLUMN LINE VOLTAGE

METHOD AND APPARATUS FOR SENSING RADIATION AND PROVIDING ELECTRICAL READOUT

The present invention relates in general to apparatus including devices and circuits therefor for sensing radiation and developing electrical signals in accordance therewith. The present invention relates in particular to such apparatus which senses and integrates charge due to electromagnetic radiation flux which stores the integrated value and which provides an electrical readout of the stored value.

This application is related to U. S. Pat. No. 3,623,026 and copending patent applications Ser. No. 792,569, filed Jan. 21, 1969, Ser. No. 203,110, filed Nov. 24, 1971 and Ser. No. 201,855, filed Nov. 24, 1971, all assigned to the assignee of the present invention. This application is also related to patent application Ser. No. 264,804 filed concurrently herewith and assigned to the assignee of the present application.

Radiation sensing apparatus are widely used in many applications to obtain electrical signals representative of the received radiation. The electrical signals are usually used to provide a visual display of the received radiation. One class of devices used in such radiation sensing apparatus includes a radiation sensitive target on which electrical charge is developed in response to received radiation and is read out by an electron beam which scans the target. Such class of imaging devices includes the well established image orthicon and vidicon and also includes newly developed devices utilizing a matrix of semiconductor diodes as targets. Such class of imaging devices require the use of an electron beam for scanning and electrical readout. Generation and control of the electron beam requires the use of vacuum tube techniques including a vacuum envelope, thermionic cathode, high voltage power supplies and usually bulky and expensive magnetic focus and deflection coils.

Various attempts have been made to provide an all solid state image sensing device in which the scanning functions as well as the image sensing functions are solid state thereby eliminating the need for an electron beam and the apparatus required to establish and operate the electron beam. One such attempt includes the use of a matrix of photo diodes which are charged to a preset voltage and discharged in accordance with the received radiation. The extent of discharge of each of the diodes is sensed, for example, by sensing the current required to recharge each of the diodes to the preset voltage. Thus a measure of the radiation received by each of the diodes is obtained. Arrays of such diode devices have poor substrate area utilization and have limited dynamic range. Also, the number of circuit connections required for each of the devices to provide device selection and read out increases the complexity of the array. In large arrays such complexity would limit yield of usable arrays obtainable in mass fabrication of such arrays. In the operation of such arrays the capacitance signal coupled from the scanning drive lines to the readout circuit is not cancelled and appears as undesired video signal variations.

More recently another class of devices referred to as surface charge storage devices have been proposed and developed utilizing a substrate of semiconductor material in a surface adjacent portion of which an array of charge storage sites are provided. Radiation incident on the substrate generates charges which are stored in the sites in accordance with radiation received thereby. Such devices are described and claimed in the aforementioned U.S. Pat. No. 3,623,026 and aforementioned patent applications Ser. No. 792,569, Ser. No. 203,110 and Ser. No. 201,885. One method of obtaining electrical read out in such devices is by row and column address of the sites along the surface of the substrate. Another method of read out includes the provision of channels in the substrate adjacent to a row of sites into which the charge is switched and then stepped out into a utilization channel. Such a method and device is disclosed and claimed in a copending patent application Ser. No. 240,843, filed Apr. 3, 1972 and assigned to the assignee of the present invention.

The present invention is directed to providing improvement in the surface charge storage devices described above.

Accordingly, an object of the present invention is to provide a radiation responsive device utilizing surface charge storage and arrays of such devices in which electrical read out is obtained by simple means.

Another object of the present invention is to provide a simple radiation responsive device utilizing surface charge storage and simple arrays of such devices which provide electrical read out and which operate with high efficiency, fidelity and reliability as well as with high sensitivity.

Another object of the present invention is to provide an array of radiation sensing elements which may be fabricated in large sizes with high yield and low cost.

Another object of the present invention is to provide an array of self scanned radiation sensing elements.

Another object of the present invention is to provide an array of radiation sensing elements of high resolution.

In carrying out the present invention in one illustrative embodiment a substrate of semiconductor material of one conductivity type is provided with an insulating member overlying a surface of the substrate and a conducting member overlying the insulating member to form a surface charge storage cell. A capacitor is provided in circuit with a source of operating potentials between the conducting member and the substrate. Switching means in shunt with the capacitor connects the terminals of the capacitor together for one period of time and disconnects them for another period of time. The polarity and magnitude of the voltage applied to the storage cell is such as to produce depletion of majority carriers in a region in the surface adjacent portion of the substrate underlying the conducting member. Exposure of the substrate to radiation generates minority carriers therein which are stored near the surface of the depletion region. Circuit means are provided for changing the potential between the conducting member and the terminal of the capacitor remote from the substrate during the time the terminals of the capacitor are disconnected from one another to inject the stored minority carriers into the substrate whereby a displacement current flows in circuit between the substrate and the capacitor and produces a voltage across the capacitor which is proportional to the minority carriers stored in the depletion region during the time the terminals of the capacitor were connected.

In another illustrative embodiment of the present invention a plurality of storage cells are provided on a common substrate and each of the cells are addressed in turn to effect injection of the charge stored therein into the substrate and produce respective voltages across a capacitor connected in circuit with the substrate. Means are provided for sampling the voltages developed across the capacitor in turn to provide a output having an amplitude varying with time in accordance with the variation in amplitude of the sampled voltages.

The novel features which are believed to be characteristic of the present invention are set forth with particularity in the appended claims. The invention itself, both as to its organization and method of operation, together with further objects and advantages thereof may best be understood by reference to the following description taken in connection with the accompanying drawings wherein:

FIGS. 1A–1C show diagrams of a conductor-insulator-semiconductor cell connected in circuit and illustrating various stages of operation thereof in accordance with one aspect of the present invention.

FIG. 1D shows a simplified schematic diagram of a linear array of sensing cells such as described in FIGS. 1A–1C.

FIGS. 2A–2C show diagrams of pairs of conductor-insulator-semiconductor cells connected in circuit and illustrating various stages of operation thereof in accordance with other aspects of the present invention.

FIGS. 3A–3C are graphs of various voltage and current signals appearing in the diagrams of FIGS. 2A–2C.

Figure 11:
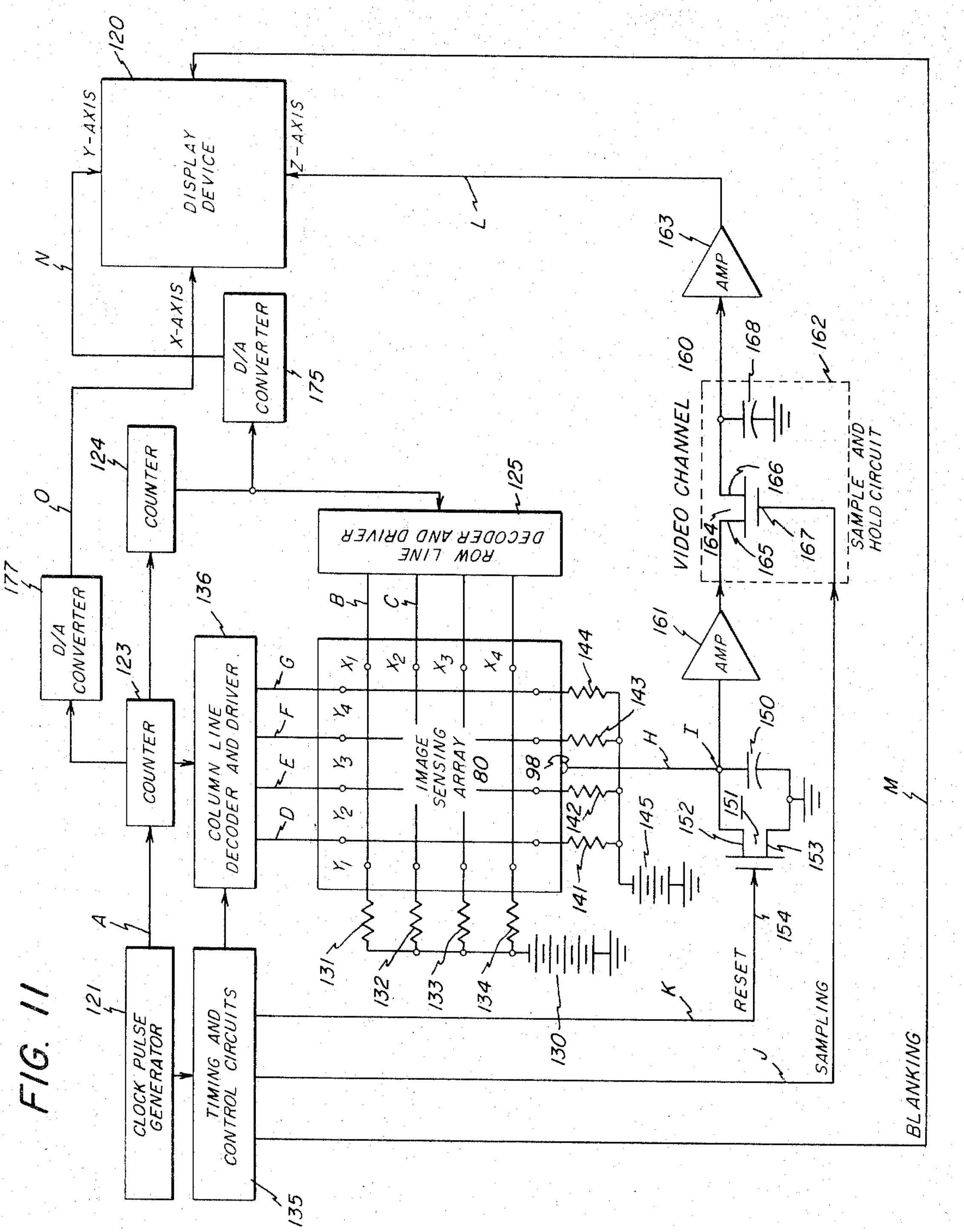
FIG. 11 is a block diagram of an image sensing and display system including the image sensing array of FIGS. 4–7. A literal designation in the block diagram refers to a corresponding literal designation in the wave form diagrams of FIGS. 12A–12O.
Figures 12A, 12B, 12C, 12D, 12E, 12F, 12G:
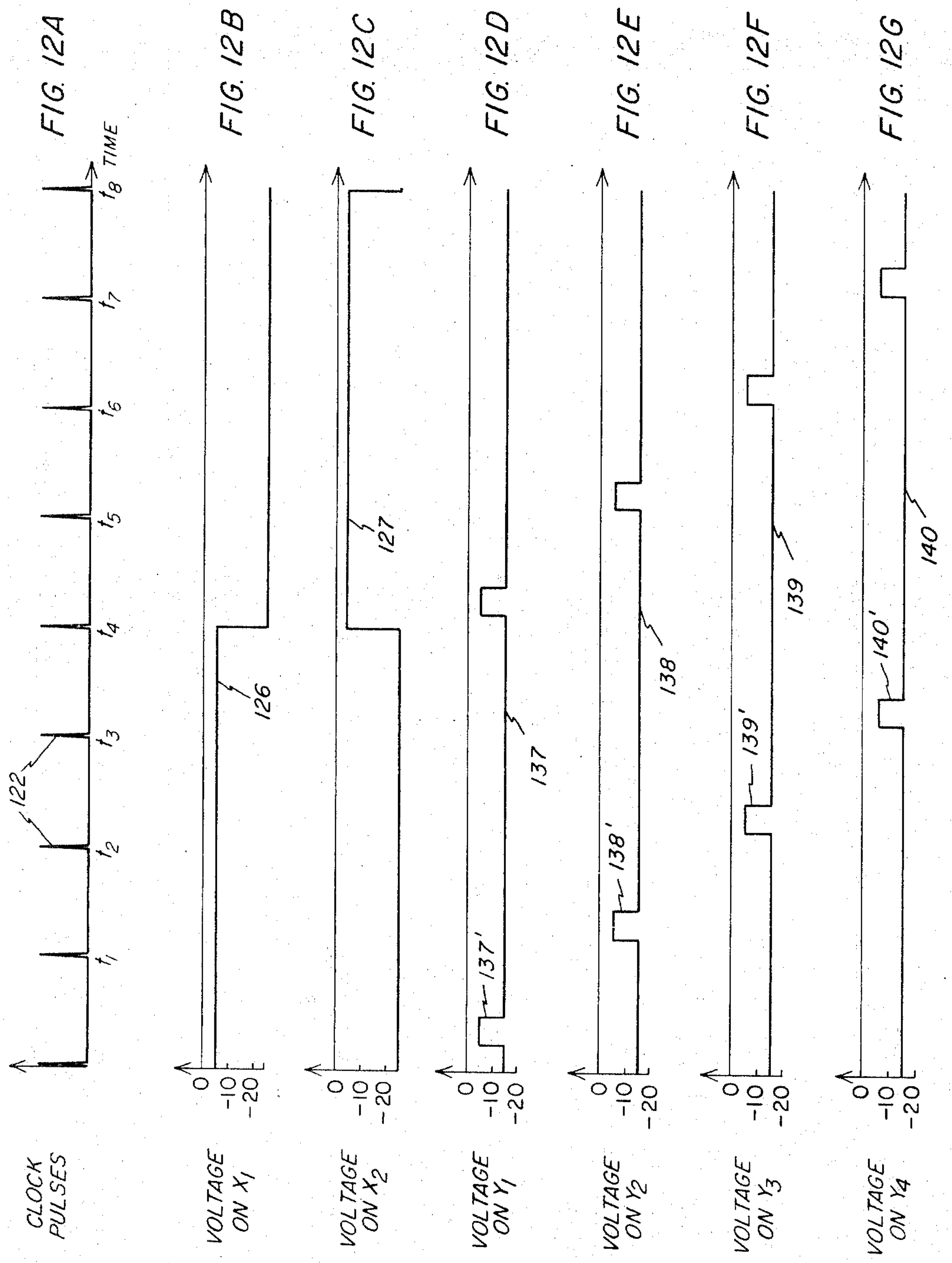

FIGS. 12A through 12–O are wave form diagrams drawn to a common time scale representing signals appearing at various points in the system of FIG. 11.

Figure 4:
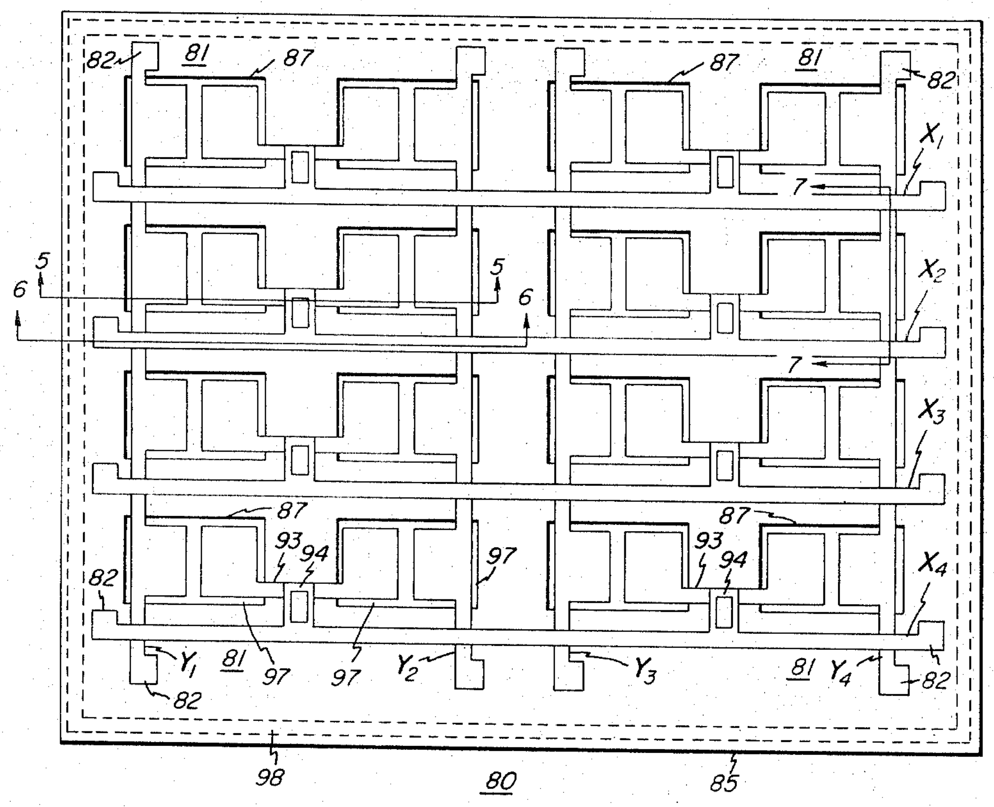
FIG. 4 is a plan view of an array or assembly of a plurality of radiation responsive cells formed on a common semiconductor substrate in accordance with the present invention.
Figure 5:
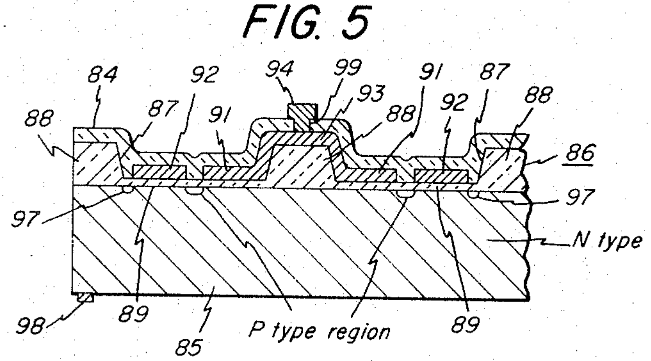
FIG. 5 is a sectional view of the assembly of FIG. 4 taken along section lines 5—5 of FIG. 4.
Figure 7:
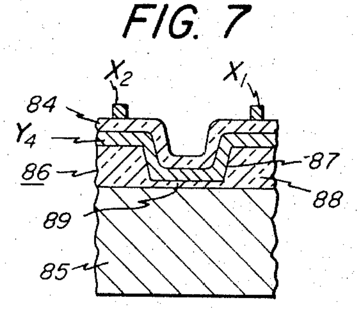
FIG. 7 is a sectional view of the assembly of FIG. 3 taken along section lines 7—7 of FIG. 4.
Figure 6:
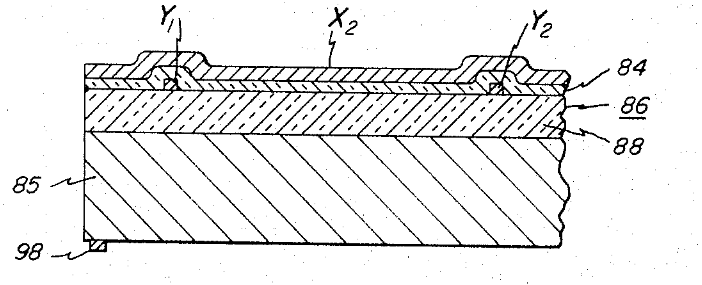
FIG. 6 is a sectional view of the assembly of FIG. 3 taken along section lines 6—6 of FIG. 4.
Figure 13:
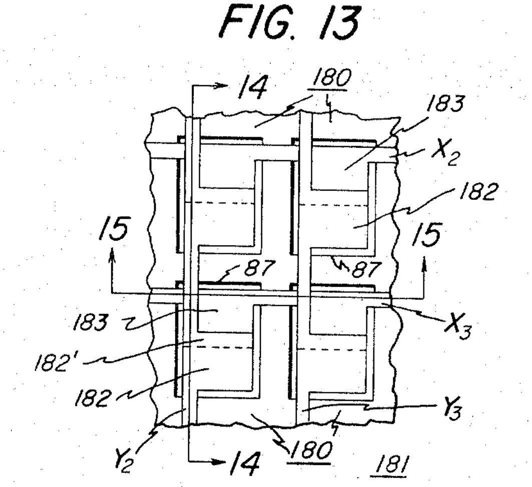

FIG. 13 is a plan view of a part of an array of sensing devices each including a pair of plates in a conductor-insulator-semiconductor structure formed on a common semiconductor substrate similar to the array of FIG. 4 showing another mode of coupling the plates of a pair of cells.

Figure 14:
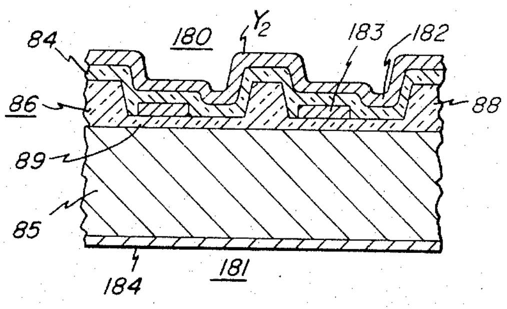

FIG. 14 is a sectional view of FIG. 13 taken along section lines 14—14 of FIG. 13.

Figure 15:
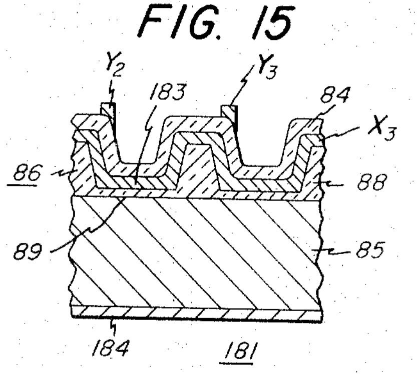

FIG. 15 is a sectional view of FIG. 13 taken along section lines 15—15 of FIG. 13.

Figure 16:
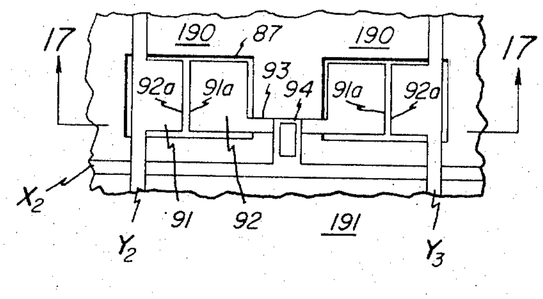

FIG. 16 is a plan view of a part of an array of sensing devices each including a pair of plates in a conductor-insulator-semiconductor structure formed on a common semiconductor substrate similar to the structure of FIG. 4 showing a further mode of coupling the plates of the cells of a device.

Figure 17:
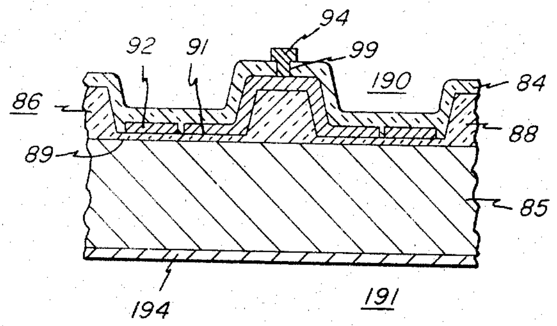

FIG. 17 is a sectional view of FIG. 16 taken along section lines 17—17 of FIG. 16.

Figure 18:
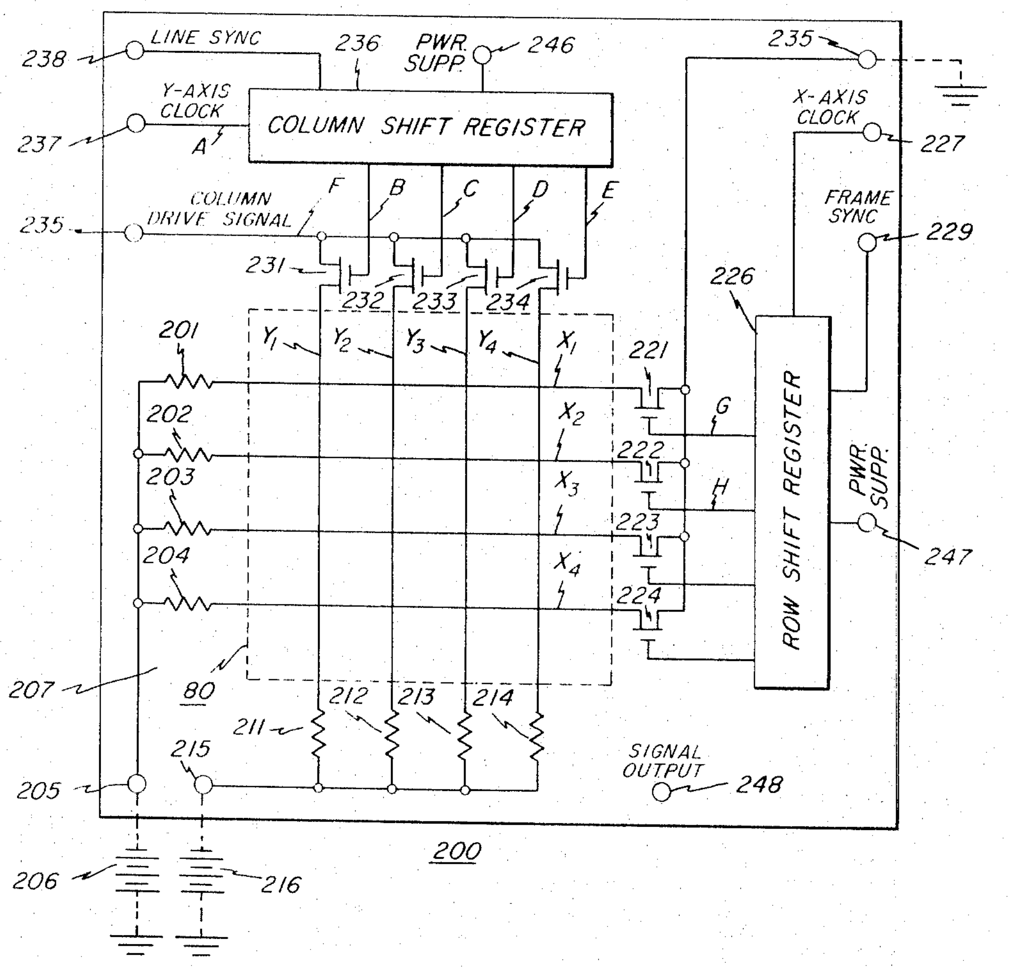

FIG. 18 is a diagram of an image sensing array in which various functional blocks for performing scanning and other functions are integrally formed on a common substrate along with sensing cells and lines therefor to provide a image sensing assembly in accordance with a further aspect of the present invention.

FIGS. 19A through 19H are diagrams of amplitude versus time drawn to a common time scale of signals occurring at various points in the assembly of FIG. 18. The place of occurrence of a signal of FIGS. 19A–19H in the block diagram of FIG. 18 is referenced in FIG. 18 by a literal designation corresponding to the literal designation of the figure reference.

Reference is now made to FIGS. 1A, 1B and 1C showing a conductor-insulator-semiconductor radiation sensing cell 10 in cross section, connected in circuit in various stages of operation in accordance with the present invention. The cell may be a part of an array of such cells formed on a common substrate of semiconductor material. The cell is not shown in exact proportion in order to clearly illustrate the various parts and operation thereof. The cell includes a substrate 11 of N-type semiconductor material, a layer 12 of insulating material overlying a major surface 13 of the substrate and a conducting member or plate 14 overlying the opposite surface of the insulating layer. The plate 14 is connected to the negative terminal of a source 15 of operating potential, the positive terminal of which is connected to ground. A pair of output terminals 16 and 17 are provided, one of which is connected to ground and the other of which is connected to the substrate 12. A capacitor 18 is connected between the terminals 16 and 17. A switch 19 functionally indicated as a single pole-single throw switch, is also connected between the terminals 16 and 17. Conveniently, the connection to the plate 14, the output terminal 17 connected to a terminal of source 15, and the output terminal 16 connected to the substrate 11 are referred to, respectively, as first, second, and third terminals.

The operation of the cell 10 in circuit will be explained by considering a specific example in which the cell 10 is constituted of specific material, in which the elements thereof are of specific proportions, and to which specific operating potentials are applied. The substrate 11 is constituted of monocrystalline silicon having a thickness of approximately 250 microns (1 micron is $10^{-6}$ meter), a resistivity of approximately 4 ohm-centimeter, and a reasonable minority carrier lifetime of the order of 50 microseconds. The insulating layer 12 is thermally grown silicon dioxide about 0.1 micron thick. The plate is a thin layer of a suitable metal such as molybdenum or aluminum vapor deposited on the insulating layer and having a contact surface area of about 1 square mil, that is, the plate 14 may be considered a plate of rectangular outline having approximately the dimensions of 1.2 mils by 0.9 mils (a mil is one thousandth of an inch). Of course, the plate may also be constituted of any conductive material such as silicon suitably doped to render it conductive. The source 15 provides a potential difference of 10 volts. With the switch 19 closed a negative potential of 10 volts is applied to the plate 14 in respect to the substrate 11 to cause majority carriers to be depleted from the region 20 in the surface adjacent portion of the substrate, the boundary of which is schematically designated by the dotted outline 21. Conveniently, the initial potential applied to the plate 14 may be referred to as the first potential and the potential applied to the terminal of the capacitor 18 remote from the substrate as the second potential. A current flows in circuit with the substrate to charge the dielectric capacitance represented by the plate to substrate surface capacitance, and the capacitance of the depletion region connected in series. The width of the depletion region, that is, the extent of penetration thereof into the surface adjacent portion of the substrate may be of the order of 3 microns immediately upon application of the indicated potentials to the cell, providing an initial depletion capacitance of approximately 0.03 picofarads per square mil. The plate to substrate or dielectric capacitance is of the order of 10 times the capacitance of the depletion region capacitance. At the instant of application of the operating potentials to the cell depletion in the region 20 is established and the potential of the surface of the region 20 drops to a value close to the potential on the plate 14. The portion of the substrate 11 outside of the region 20 is at ground potential. Accordingly, the potential gradients in the depletion region are oriented to cause minority carriers, holes in the case of N-type conductivity semiconductor material, generated by radiation and collectively designated by the arrow 22 entering the depletion region to be swept across the depletion region and be stored at the surface thereof to form an inversion layer of a conductivity type opposite to the conductivity type of the substrate. As a hole is swept to the surface of the depleted region an electron moves out from the substrate connection 16 to the plate 14 to provide a balancing charge thereon. This is schematically indicated by arrow 23.

Reference is now made to FIG. 1B which shows the cell of FIG. 1A after the elapse of a period of time during which charges have been generated in response to radiation and accumulated in the inversion layer, schematically designated by positive charge signs 24 near the surface of the region 20. Such accumulation causes the extent or width of depletion in the substrate to decrease as indicated by boundary line 21 and also causes the potential of the surface of the region 20 to increase toward ground.

In FIG. 1C, the switch 19 is open and subsequent thereto the potential of the plate 14 is increased to a third potential, i.e., ground in the example under consideration indicated by a zero adjacent a terminal of the source 15 connected to plate 14. The increase in potential of the plate 14 from a negative value to a zero value causes a reduction in the electric field that maintained the charge in the surface inversion layer and causes the minority carriers stored in the inversion layer 24 to be injected into the substrate. The injection of minority carriers is indicated by the distribution of positive charge throughout the substrate 11. Such injection causes a neutralizing negative charge to flow into the substrate, i.e., a conventional current to flow out of the substrate. Such current flows from the substrate 11 into the capacitor 18 which becomes charged to a value dependent on the injected charge. The minority carriers injected into the substrate eventually diffuse or recombine therein. Reestablishment of the depletion region for another cycle of operation should await disappearance of such minority carriers from the region 20, otherwise the stored charge would be reaccumulated or recollected in the reestablished depletion region.

In one mode of operation, the switch 19 connects the substrate terminal 16 to ground and thereafter a negative potential is applied to the plate to reestablish the depletion region in the substrate for another radiation sensing cycle. Accordingly, the cell is exposed to radiation for a period of time which may be relatively long to store charge which is a function of the time integral of radiation flux on the region 20 and regions adjacent thereto. During a second period of time, that is, the time for readout which time may be quite short, charge is injected by returning plate 14 to zero potential at the same time switch 19 is opened. The integrated charge due to radiation and depletion region charge is stored in the capacitor 18. Successive samples may be taken of the voltage appearing on the integrating capacitance 18 to provide a video signal representative of the variation in radiation sensed by the cell. In an alternative circuit for this mode of operation the integrated capacitor may be eliminated and the peaks of the displacement currents produced by injection in successive cycles of operation are sensed and video signals developed therefrom.

In another preferred mode of operation of the structure of FIGS. 1A, 1B and 1C the potential on plate 14 is returned to its original value prior to closing of the reset switch 19 and subsequent to the time during which the injected minority carriers have disappeared from the region 20. In this mode of operation the current flow into the substrate subtracts from the current flow out of the substrate. The depletion region component of current flow out of the substrate, identified as due to remaining depletion charge, is very nearly equal to the current flow into the substrate which initially established the depletion region, referred to as depletion region charging current. As minority carriers generated in response to received radiation are progressively stored in the inversion layer, the extent or width of the depletion region is progressively reduced, i.e., the mobile charge produced by radiation progressively reduces the electric field in the substrate and hence the width of the depletion region. Therefore, the depletion region component of current in the current flowing out of the substrate on injection becomes progressively less as photon generated charge is accumulated. Accordingly, when the time integral of depletion region charging current is substracted from the time integral of injection current plus remaining depletion charge current, the net charge as a function of received radiation is substantially linear at low levels of storage and progressively departs from linearity at increasing storage levels until at maximum storage level, or saturation, the departure from linearity becomes maximum. However, as depletion region establishing charge is substantially smaller than charge stored at saturation level, the performance of the device is not appreciably affected. Even were it considered significant such non-linearity is easily compensated for in the utilization circuits in which the device is incorporated, if necessary or desired.

Samples may be taken of the voltage on the integrating capacitor resulting from successive cycles of operation of the cell to provide a video signal which represents the integrated value of radiation falling on the cell in successive cycles of operation. Thus, in this mode of operation spurious signals produced in the video output due to the drive voltages applied to the cell are largely eliminated. In the case of an array, charge contained in the stray capacitance of the conductors connected to the plate of the device being read out is also included in current flowing into the integrating capacitance. This component of current can be quite large in relation to the current flow in response to injection of the charge. However, as this component of current is not affected by storage of charge in the device, it is completely cancelled by reestablishment of storage potential on the device. Also, in arrays, variations in the cell capacitances are eliminated as long as the first and third potential levels do not vary in the scanning of the array. While in the example the third potential applied to the plate 14 was ground or identical to the second potential, it should be readily apparent that the third potential could be any potential between the first and second potentials as will be apparent below.

The cell disclosed in FIGS. 1A, 1B and 1C may be utilized in a linear or one dimensional array of such cells which are scanned or addressed in turn to provide an electrical signal of the radiation incident on the array. Each cell may be periodically operated to execute in turn the sequence represented by FIGS. 1A, 1B and 1C to provide a signal at the output terminals. The voltage at the output terminals would be sampled in turn to provide a video signal representing the received radiation. The linear array of elements may be arranged in two dimensions, that is in rows and columns in which the elements in a first row are scanned followed in turn by elements in a second row and so forth until the entire array has been scanned.

FIG. 1D shows a simplified schematic diagram of one such one-dimensional array of sensing cells such as described in FIGS. 1A, 1B and 1C. In this figure, the substrate 25 represents the substrate of the cell 26 to be addressed for readout. The substrate 27 schematically shown as larger than substrate 25 represents the substrate of the other cells 28 of the array. The substrates of the cells of the array may be separate or formed in a common body or wafer of semiconductor material. The capacitance 31 represents the capacitance between the plate of the cell 26 and the surface of the substrate 25. The capacitance 32 represents the collective capacitances of the plates of the other cells 28 in relation to the surface of the substrate 27. The substrates 25 and 27 are connected together by conductor 33 on which is provided with output terminal 29. Terminal 30 connected to ground provides the other output terminal. The plate of cell 26 is connected through an isolation resistance 34 to the negative terminal of a source 35 of potential, the positive terminal of which is connected to ground. The plates of the other cells 32 are connected through a collective isolating resistance 36 to the negative terminal of the source 35. The plate of cell 26 is connected through switch 40 to ground. The plate of each of the cells 27 is also connected to ground through a respective switch (not shown, as it is used only at the time the cell is being addressed for read out). A reset switch 42 is connected between the output terminals 29 and 30. In this circuit the integrating capacitance which is relatively large, is now provided by essentially the sum of the depletion capacitances of cells 28 and the stray capacitance of the array. The integrating capacitance should be large in relation to the dielectric capacitance of a cell. External capacitance may be added in shunt with the inherent capacitance of the array, if needed or desired.

In the operation of the circuit of FIG. 1D, initially the reset switch 42 is closed, thereby providing a potential between the plates and substrate of the array and establishing an individual depletion region 45 and collective depletion region 46 in the substrates 25 and 27, respectively. The substrates of cell 26 and the collective cell 28 are charged to ground potential. Radiation produced charge is stored in the depletion regions. After a period of time, sufficient for radiation generated charge to accumulate in depletion region 45, the switch 42 is opened. As the capacitance of collective cell 28 is large, the potential of the substrate 27 remains essentially at ground. Next, the read out switch 40 is closed connecting the plate of cell 26 to ground and causing the charge stored in the depletion region 45 to be injected in the substrate 25. Such injection causes displacement current to flow out of the substrate 25 into the capacitance of the collective cell 28 of the array thereby producing a change in voltage between the output terminals 29 and 30. Opening of the read out switch 40 after the injected minority carriers have either recombined or diffused away from the depletion region causes a net voltage to appear across the output terminals 29 and 30 which represents the radiation generated charge stored in the cell 26. The net voltage may be sampled. The reset switch 42 is then closed and the system is automatically reset for another read out operation on another cell. Accordingly, in sequence the cells of a linear array of cells so connected may be read out to provide respective voltages which in turn may be sampled to provide a video signal. Although isolating resistors 34 and 36 have been shown connected, respectively to the plates of the cells 26 and 28, th plates could just as well have been represented as connected to points which are pulsed individually as described.

Reference is now made to FIGS. 2A, 2B and 2C which show a pair of coupled sensing cells particularly suitable for operation in two dimensional arrays. FIG. 2A shows the coupled cells at a stage in which charge has accumulated in the depletion regions thereof and would correspond to the stage represented in FIG. 1B. FIG. 2B shows a stage in the operation of the coupled cells in which the charge stored in one cell has been transferred to the other cell. FIG. 2C shows the read out stage in the operation of the coupled cells and would correspond to the stage represented by FIG. 1C. FIG. 2A shows a device 50 including a substrate 51 of N-type conductivity semiconductor material, an insulating member 52 overlying the major surface 53 of the substrate, and the pair of plates 54 and 55 overlying the insulating member. Plate 54 is adapted to be connected to row conductor line of an array consisting of rows and columns of radiation sensing devices. Plate 55 is adapted to be connected to a column conductor line of the array. Integrating capacitor 18 is connected between the substrate terminal 16 and ground terminal 17. A reset switch 19 is connected across terminals 16 and 17. Plates 54 and 55 are closely spaced and the substrate underlying the space between the plates is provided with a P-type conductivity region 56. The plate 54 and plate 55 are connected to operating potential points on a source (not shown) of operating voltage to provide the indicated negative potentials with respect to ground, i.e., $V_x = -10$ volts and $V_y = -10$ volts. The device 50 and associate operating circuit is similar to the device 10 of FIG. 1A and its operating circuit. Accordingly, the terminals of device 50 and operating potentials therefor may be similarly designated. The connection to column oriented plate 55, the ground terminal 17, and the substrate terminal are referred to respectively as first, second and third terminals, and, in addition, the connection to the row oriented plate 54 is referred to as the fourth terminal. The storage potentials applied to the column oriented plate 55 and to the row oriented plate 54 are referred to respectively, as first and fourth potentials. The reference or ground potential is referred to as the second potential. The injection potential for the column oriented plate 55 is referred to as the third potential. In structure, the device 50 is identical to the device 10 except for the addition of plate 54 which is identical to plate 55 and spaced therefrom on insulating member 52 and for the provisions of a P-type conductivity region in the substrate underlying the space between the plates 54 and 55.

When potentials of appropriate polarity with respect to the substrate and appropriate magnitude, for example the −10 volts indicated in FIG. 2A, are applied to the plates 54 and 55, a pair of depletion regions 57 and 58 are formed which are connected together by the high conductivity P-type region 56 which also has a depletion region 59 associated with it. Accordingly, charge stored in one of the depletion regions under either of the plates 54 and 55 may readily flow to the other depletion region through the P-type conductivity region 56. As in the case of FIG. 1B, radiation flux entering the depletion region causes the generation of minority carriers which are stored at the surface of the depletion regions. This condition is indicated by current flow into the substrate as charge accumulates in the surface portion of the depletion regions and corresponds to conduction of electron charge in the external potential applying circuits between the plates and the substrate. FIG. 2B shows the condition of the device when the voltage on plate 54 is set at zero to collapse the depletion region and cause the charge that was stored therein to flow or transfer into the inversion layer in region 58 underlying the plate 55. To read out the charge that has been stored in the inversion layer, potential on the plate 55 is reduced to zero after the reset switch 19 connected across the integrating capacitor 18 has been opened. Such action causes the carriers stored in the inversion layer to be injected into and produce a current flow out of the substrate representing the charge stored in the depletion region as described in connection with FIG. 1C.

Reference is now made to FIGS. 3A, 3B and 3C which show, respectively, graphs of column oriented plate drive voltage $V_y$, read out current, and integrating capacitor voltage drawn to a common time scale for the device shown in FIGS. 2A, 2B and 2C for two different conditions of charge storage in the cells, one in which no radiation produced charge has been stored and the other in which charge has been stored in response to radiation. It is assumed that the voltage $V_x$ of the row oriented plate has been reduced to zero. FIG. 3A shows identical pulses 61 and 62 of drive voltage applied to the plate 55 in different cycles of operation. FIG. 3B shows the currents which flow through the substrate connection in response to the application of such pulses. FIG. 3C shows the voltage developed across the capacitor 18 due to the current flow shown in FIG. 3B. FIG. 3C also shows the periods of time during which the reset switch 19 is open and periods of time during which it is closed. The first pair of current pulses 63 and 64 shown in FIG. 3B represent a condition in which no radiation has been received and hence no charge stored in the column oriented cell of the device 50. During the change of voltage from a minus ten volt level to ground level, the charge used to establish the depletion region 58 flows out and appears as the positive going pulse 63. After the read out period the voltage on the plate is returned to its minus ten volt level and produces charge flow, represented by a current pulse 64 to establish the initial depletion region under the plate 58 and is equal to the current pulse 62. Accordingly, a voltage pulse 65 is developed across capacitor 18 which is essentially identical in form except for its amplitude to pulse 61. The net voltage output at the end of the integration operation is zero as shown in FIG. 3C. Attention is now directed to pulses 67 and 68 produced in response to application of pulse 62 to the column oriented cell. The positive pulse 67 of large amplitude represents the charge stored in the depletion region 58 in response to radiation as well as some of the charge which flowed into the substrate as a result of the depletion region capacitance. The negative pulse 68 of small amplitude represents current which flows into the substrate to establish the initial depletion region therein. Integration of pulses 67 and 68 in capacitor 18 produces a pulse 70 of the form shown. Initially, the voltage across the capacitor 18 rises to a large amplitude or level 71 due to the first pulse 67 of current and upon occurrence of the second pulse 68 of current the voltage on the capacitor drops to a second level 72, conveniently referred to as the back porch of the pulse. The second lever 72 represents a voltage corresponding to the charge stored in the inversion layer of region 58. Note that the reset switch 19 is open during the sampling interval, i.e., during the occurrence of the voltage pulses of FIG. 3C of each cycle of operation of the sensing device and remains closed during the remainder of the cycle during which storage of charge is occurring in the device in the case of a system with a single device. Successive cycles of operation of the device in circuit would produce successive voltage pulses such as pulse 70, the back porch of which varies in accordance with the radiation incident on the device during the storage period. Sampling the back porch of the successive voltage pulses would provide a signal representing the variation of radiation incident on the device as a function of time. In the case of an array of such devices the switch which shorts out the integrating capacitance common to all of the devices of the array is opened and closed during the readout of each device of the array and accordingly is cycled many times during a storage and readout cycle of a single device of the array.

An array and the manner in which such an array is made will be described in connection with FIGS. 4, 5, 6 and 7. A more detailed explanation of the various modes of operation of the cells will be described in connection with FIGS. 8A–8F, 9A–9F, and 10A–10F. A system incorporating the array of FIG. 4 will be described in connection with FIGS. 11 and 12A–12D. However, before proceeding with a description of the array of FIG. 4, it will be instructive to consider the operation of a cell of FIG. 1A–1D or the cells of FIG. 2A–2C. The dielectric capacitance of the cell is preferably large in relation to initial depletion capacitance of the cell to provide large ratio of storage capability for photon generated charge to spurious current due to charging and discharging of the depletion region. A ratio of dielectric to depletion capacitance of ten to one in each of the cells of a two dimensional array of a large number of cells provides adequate storage capability to represent a large range of radiation intensities while the spurious signal due to the depletion region is small enough that amplifier overloading and consequent loss of cancellation of capacitive signals from the unaccessed cells in a column of the array does not occur. Two ways in which to alter the ratio for given operation potentials is by altering the insulating layer thickness or by altering the resistivity of the substrate.

Also, the integrating capacitance is preferably large in relation to the dielectric capacitance of a cell in order to provide relatively small fluctuations in substrate potential in the cyclical operation of the cell. With larger integrating capacitance, the voltage variation thereon in response to signal currents from the substrate are correspondingly smaller i.e., the signal to noise ratio of the sampled signal decreases. With smaller integrating capacitance the variation in substrate potential becomes larger and correspondingly less charge is injected into the substrate for a given difference between storage potential and injection potential on the plate of the cell, or expressed in other words a greater such difference in potential is required to obtain full injection of stored charge.

It is also instructive to consider what happens when a cell such as described in FIGS. 1A, 1B and 1C has a step voltage applied between the substrate and the plate of a polarity and magnitude as to produce depletion in a surface adjacent region thereof, i.e., when plate is negative with respect to substrate. At the instant of application of the step voltage, the depletion extends to a certain distance inward from the surface of the substrate. The potential at the surface is close to the potential on the plate i.e., negative. The potential as a function of distance into the substrate increases until at the aforementioned certain distance it is at ground potential. With the passage of time, minority carriers generated in the depletion region by the thermal energy of the cell and by radiation incident on the cell are impelled to the surface of the depletion region by the aforementioned potential gradient in the depletion region and held there by the established electric field. The corresponding electrons of hole-electron pairs that are generated travel in the external biasing circuit to the plate where they are stored. The accumulation of minority carriers in a layer near the surface has the effect of altering the conductivity type thereof, raising the potential of the surface of the semiconductor, and reducing the distance to which depletion extends into the semiconductor. After the passage of a relatively long time depending on the rate of generation of minority carriers, sufficient charge is stored in the inversion layer to raise the surface potential to an equilibrium value close to and fixed in relation to ground potential. The equilibrium surface potential is less than the potential of the bulk of the substrate or ground by a value which is essentially a function of the band gap of the semiconductor material used for the substrate and the concentration of activators therein and would correspond to the difference in voltage level of the valence band in the bulk of the substrate and the voltage level of the valence band at the inward directed face of the inversion layer. At equilibrium, $\phi_S = \phi_B$ where $\phi_S$ is the potential difference between the bulk Fermi level and the valence band level at the inward directed face of the inversion layer, and $O_B$ is the potential differecne between the bulk Fermi level and the conduction band level in the bulk of the substrate. For the 4 ohm-cm N-type silicon material at equilibrium referred to herein the surface potential differs from the potential in the bulk by a fraction of a volt. At equilibrium, the depletion capacitance has increased to a value large in relation to its initial value. The total charge stored in the cell at equilibrium is equal approximately to the product of the dielectric capacitance and the applied voltage less the threshold voltage. Threshold voltage is defined as the voltage at which the conduction and valence bands are bent such that the potential difference between the valence band at the surface and the bulk Fermi level is equal to the potential difference between the conduction band and the bulk Fermi level in the bulk of the semiconductor. If nothing further is done the charge will remain in the inversion layer as equilibrium is established. Further thermal agitation of the semiconductor or further illumination of the cell with radiation will have essentially no effect on it. Returning the plate to ground after the cell is fully charged collapses the field in the cell. Accordingly, the minority carriers in the inversion layer are released or injected into the bulk semiconductor and a corresponding displacement current flow in the external circuit connecting conductor to substrate. Of course, should injection of the charge in the inversion layer occur prior to saturation of the cell, i.e., surface potential reaching equilibrium value, a current flow is obtained representing that level of charge storage. In accordance with one aspect of the present invention, the conductor-insulator-semiconductor cells provided herein are operated in various modes as will be more fully explained below in connection with FIGS. 8A–8F, 9A–9F and 10A–10F before equilibrium is reached.

Operating in an array, a cell would store charge in response to radiation during the first period of time. The first period of time should be set to be less than would result in complete saturation of some of the cells of the array. Read out of stored charge is accomplished during a second subsequent period of time usually substantially shorter than the first period. A cell stores charge while the other cells of the array are being read out in sequence. The second period should be longer than the time required for the injected carriers to diffuse from, recombine in, or be removed in some other way from the region initially depleted to avoid collection of the previously stored and injected charge. The lower limit on rate of scan for a given size array is governed by the intensity of the received radiation, the storage capability of a cell and the rate of thermal generation of carriers. The upper limit is, of course, governed by the aforementioned diffusion and recombination times.

When the cells of an array are exposed for a long period of time, they become completely filled with charge i.e., equilibrium is reached, and provide very little information on the image sensed.

The switch connected across the integrating capacitance is closed during a third period while a cell is storing charge and is open during a fourth period when charge from a storage site is being injected into the substrate. It has been pointed out above that as the same switch is used for each cell it is opened and closed many times during the storage period of the cell or the time the device is not being read out. However, as substrate potential is close to ground or reference potential, the storage function essentially is unaffected. In the preferred mode of operation, the switch is closed at the instant of reestablishment of depletion in the cell for a cycle of a succeeding cell, and is referred to as the reset time, and is opened at the instant of charge injection into the substrate.

Minority carriers are generated in the substrate of a cell at one rate due to thermal energy and at another rate due to photon flux. Thermal energy alone will cause a cell to reach equilibrium over one interval of time determined by the thermal rate of generation of minority carriers. Photon energy alone will cause a cell to reach equilibrium over another interval of time determined by the photon rate of generation of minority carriers.

For an array of cells to be useful, the rate of photon generation of minority carriers preferably should exceed the thermal rate of generation over a scan cycle. Were the cells of an array uniform in thermal generation of carriers, the thermal rate could exceed the photon rate and a useful signal still be obtained. When the thermal rate of generation of carriers is non-uniform, the cell with the highest thermal generation rate sets the photon rate for which the sensor would probably be designed.

Reference is now made to FIGS. 4, 5, 6 and 7 which show an image sensing array 80 of radiation sensing devices 81, such as device 50 described in FIGS. 2A, 2B and 2C, arranged in four rows and columns. The array includes four row conductor lines, each connecting the row-oriented plates of a respective row of devices, and are designated from top to bottom $X_1$, $X_2$, $X_3$ and $X_4$. The array also includes four column conductor lines, each connecting the column-oriented plates of a respective column of devices, and are designated from left to right $Y_1$, $Y_2$, $Y_3$ and $Y_4$. Conductive connections are made to lines through conductive landings or contact tabs 82 provided at each end of each of the lines. While in FIG. 4 the row conductor lines appear to cross the column conductor lines, the row conductor lines are insulated from the column lines by a layer 84 of transparent glass as is readily apparent in FIGS. 5, 6 and 7. In FIG. 4 the outline of the structure underlying the glass layer 84 is shown in solid outline for reasons of clarity.

The array includes a substrate or wafer 85 of semiconductor material of N-type conductivity over which is provided an insulating layer 86 contacting a major face of the substrate 85. A plurality of deep recesses 87 are provided in the insulating layer, each for a respective device 81. Accordingly the insulating layer 86 is provided with thick or ridge portion 88 surrounding a plurality of thin portions 89 in the bottom of the recesses. On the bottom or base of each recess are situated a pair of substantially identical conductive plates or conductive members 91 and 92 of rectangular outline. Plate 91 is denoted a row-oriented plate and plate 92 is denoted a column oriented plate. The plates 91 and 92 of a device 81 are spaced close to one another along the direction of a row and with adjacent edges substantially parallel. In proceeding from the left hand portion of the array to the right hand portion, the row-oriented plates 91 alternate in lateral position with respect to the column oriented plates 92. Accordingly, the row-oriented plates 91 of pairs of adjacent devices of a row are adjacent and are connected together by a conductor 93 formed integral with the formation of the plates 91. With such an arrangement a single connection 94 from a row conductor line through a hole 99 in the aforementioned glass layer 84 is made to the conductor 93 connecting a pair of row-oriented plates. The column-oriented conductor lines are formed integrally with the formation of the column-oriented plates 92. The surface adjacent portion of the substrate 85 underlying the space between the plates 91 and 92 of each device 81 is provided with a P-type conductivity region 96 corresponding to the P-type conductivity region 56 of FIG. 2A. Region 97 in the substrate is also of P-type conductivity and is formed concurrently with the formation of P-type region 96 in accordance with a diffusion technique for the formation thereof in which the plates 91 and 92 are used as diffusion masks. The glass layer 84 overlies the thick portion 88 and thin portion 89 of the insulating layer 86 and the plates 91 and 92, conductors 93 and column-oriented conductor lines $Y_1$–$Y_4$ thereof except for the contact tabes 82 thereof. The glass layer 84 may contain an acceptor activator and may be utilized in the formation of the P-type regions 96 and 97. A ring shaped electrode 98 is provided on the major surface of the substrate opposite the major surface on which the devices 81 were formed. Such a connection to the substrate permits rear face as well as front face interception of radiation from an object to be sensed.

The image sensing array 80 and the devices 81 of which they are comprised may be fabricated using a variety of materials and invariety of sizes in accordacne with established techniques for fabricating integrated circuits. One example of an array using specific materials and specific dimensions will be describe. The semiconductor material is a wafer of monocrystalline silicon of N-type conductivity, of 4 ohm-cm resistivity, and 10 mils thick. The insulating layer is thermally grown silicon dioxide with the thin portions 89 of 0.1 micron thereof underlying the plates separately grown after etching of an initially uniformly thick layer of 1 micron of thermally grown silicon dioxide to form the recesses 87 therein. The row-oriented rectangular plates 91 and the column-oriented plates 92 are made of vapor deposited molybdenum. The plates are 1.2 mils by 0.9 mils and adjacent edges are spaced apart by 0.2 mil. The connections 93 between adjacent row-oriented plates of adjacent deivces of a row and the column conductor lines $Y_1$–$Y_4$ are also of molybdenum and are integrally formed with the formation of row-oriented plates 91 and column-oriented plates 92. The insulating layer 84 is a borosilicate glass which is vapor deposited over the plates 91 and 92 and the conductors thereof. As will be explained below the P-type region in the substrate is formed by diffusion from the borosilicate glass layer 84 through the thin portion 89 of silicon oxide layer 86. The row-oriented conductor lines $X_1$–$X_4$ are constituted of vapor deposited aluminum overlying the insulating layer 84. Openings 99 in the insulating layer 84 over the conductors 93 interconnecting adjacent row-oriented plates 91 of adjacent devices of a row enable connections 94 to be made therethrough so that all the row-oriented plates of a row are connected to the row conductor line of that row. The ring electrode 98 forms an ohmic contact with the substrate.

Starting with the N-type silicon wafer 85 a thick layer of field oxide 86 is thermally grown thereon. Recesses extending to surface on the silicon wafer are fomred in the oxide layer 86 using conventional photolithographic techniques and thereafter the thin portions 89 of the layer are thermally grown to the desired extent to form the bases of the recesses 87. A layer of molybdenum of 0.4 micron thick is vapor deposited over the exposed portions of the insulating layer. The molybdenum layer is patterned using conventional photolithographic techniques to form the plates 91 and 92, the conductors 93, and the column-oriented lines $Y_1$–$Y_4$. Next, a low temperature borosilicate glass is deposited over the wafer to form the insulating layer 84. The wafer 85 is heated to drive boron from the layer 84 through the thin portions 89 of layer 86 in the bases of the recesses 87 that are not masked by the molybdenum conductors and into the silicon substrate to form the P-type conductivity regions 96 and 97 therein. The insulating layer 84 is patterned with holes 99 extending to the conductors 93 and thereafter a layer of aluminum 1 micron thick is deposited by evaporation over the surface of the insulating layer 84. The layer of aluminum etends into the holes 99 and makes connection with the conductors 93. The layer of aluminum is patterned to provide the row-oriented conductor lines $X_1$–$X_4$.

Reference is now made to FIGS. 8A–8D, which represent stages in the cycling of a device 81 of the image sensing array 80 of FIG. 4 when the array is scanned on a row by row and column by column basis. The scanning of the array will be described in greater detail in connection with FIGS. 11 and 12A–12O. In a typical scanning cycle of the complete array the voltage on the row conductor line of the row being scanned is changed from a fourth predetermined voltage to a third predetermined voltage and returned to the fourth predetermined voltage after all of the column conductor lines have been scanned. To read out each device in turn in the row of devices being scanned, the voltage on each of the column conductor lines in turn is changed from a first predetermined voltage to a third predetermined voltage and returned to the first predetermined voltage. In the diagrams of FIG. 8A–8D, particular values of voltage of −20, 0, and −10 are utilized, respectively, for the fourth, third and first predetermined voltages. The values of −20 volts and −10 volts are well beyond the threshold voltage of a few volts which is characteristic of the cells of which the devices are constituted.

Figures 8A, 8B, 8C, 8D, 8E, 9A, 9B, 9C, 9D, 9E, 10A, 10B, 10C, 10D, 10E:
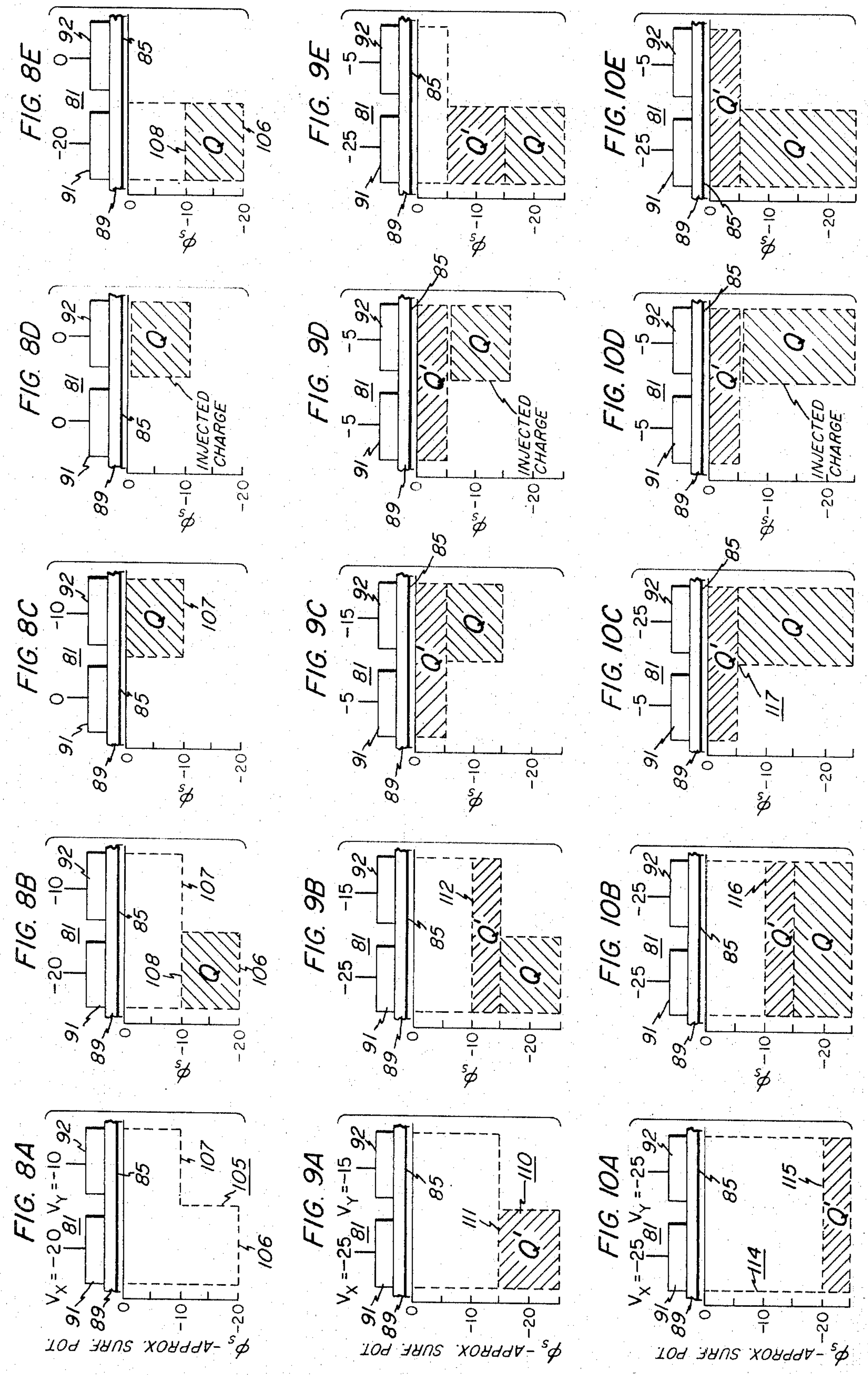
FIGS. 8A–8E are diagrams which will be used in explaining one mode of operation of the sensing cells of FIGS. 2A–2C and of FIG. 4–7. Each figure includes a portion of a device including two coupled conductor-insulator-semiconductor cells with various potentials applied to various elements thereof along with a diagram of the potential at the surface of the semiconductor substrate thereof.
FIGS. 9A–9E are diagrams similar to the diagrams of FIGS. 8A–8E which will be used in explaining another mode of operation of the sensing cells of FIGS. 2A–2C and of FIG. 4–7.
FIGS. 10A–10E are diagrams similar to the diagrams of FIGS. 8A–8E which will be used in explaining a further mode of operation of the sensing cells of FIGS. 2A–2C and FIGS. 4–7.

Each of the FIGS. 8A–8D include an end view of the device 81 showing the row connected or row-oriented plate 91, the column connected or the column-oriented plate 92, the thin insulating layer 89 and the semiconductor substrate 85. Below each of the devices of the figures is shown a diagram in which the abscissa represents distance along the surface of the substrate and in which the ordinate represent approximate surface potential of the substrate, $O_S$. In FIG. 8A the outline 105, conveniently referred to as a composite potential well as it is constituted of two closely coupled potential wells, one under plate 91 and the other under plate 92, represents the variation of potential along the surface of the substrate at the instant of application of the indicated voltages, i.e., in the absence of charge stored in the cells of the device. The level 106 represents the potential at the surface of the substrate under plate 91 and the level 107 represents the potential of the surface of the substrate under plate 92. While the levels 106 and 107 are shown to have respective values of −20 and −10 volts, the actual absolute values are less than indicated by a factor dependent on the threshold voltage of the conductor-insulator-semiconductor structure, and the ratio of oxide capacitance to depletion layer capacitance. In response to both thermally generated and radiation generated minority carriers in the depletion regions of the cells and within a diffusion length thereof the potential wells accumulate and store such minority carriers. Any minority carriers generated in the substrate under the column-oriented plate 92 flow into the potential well under the row-oriented plate 91 because of the difference in potential levels 106 and 107 until the surface potential under plate 91 rises to level 108 equal to level 107 as shown in FIG. 8B. The cross hatched area designates stored minority carriers substantially all of which were produced by photons and conveniently will be referred to as photon generated charge Q. The condition shown is one of maximum charge storage for the device and is chosen for purposes of explanation of the principles of the invention. Assume that such a condition results from accumulation of photon generated carriers substantially over a scan cycle of the device of the array. FIG. 8C represents the charge storage condition of the device preparatory to read out of the stored charge, i.e., when the row oriented plate voltage is reduced to zero. Under this condition the charge stored in the row oriented cell of the device is "dumped" or flows into the column oriented cell raising the surface potential thereof to the equilibrium value which conveniently is shown as zero. Actually the equilibrium surface potential is less than zero by a fixed value as pointed out above but is close enough to zero for purposes of describing the invention. The important considerations are that it have a fixed value in relation to ground and that it have a value sufficiently separated from the value at initial depletion to permit storage of photo generated charge. FIG. 8D represents the charge storage condition of device upon raising of the voltage of the column-oriented plate 92 to zero to cause the stored charge to be injected into the substrate. Conveniently the injected charge is shown as a block of charge Q separated from the zero axis of the graph. It should be noted that some of the minority carriers generated in the depletion regions of the cells of the device went to fill the fast surface states at the surface of the substrate as their probability of occupancy was increased by the bending of the conduction and valence bands of the substrate in the surface adjacent portion thereof in response to the applied storage voltage. Such charge is injected upon changing the voltage on the plate 92 to zero. The injected charge is sensed in the manner explained in connection with FIGS. 2A, 2B and 2C and will be further described in connection with FIG. 12. The stored charge Q is proportional to the time integral of radiation or photon flux intercepted by the depletion regions of the cells of the device and corresponds to a saturation level of received radiation. The row-oriented and column-oriented plate voltage were selected in the ratio of two to one so that under the condition represented by FIG. 8C the column-oriented cell would be able to store all of the charge in the device without resulting in unwanted injection of the excess charge into the substrate. It is apparent that were less than the maximum charge Q stored in a cycle of the cell all of such charge would be injected.

After the stored charge has been injected and has disappeared from the region of depletion of the column-oriented cell the plate 92 thereof is lowered to −10 volts to produce a potential well such as shown in FIG. 8C without the stored charge Q. After the devices of a row have been scanned the voltages of the row line and hence the row-oriented plate 91 is lowered to −20 volts to produce essentially the composite potential well 105 such as shown in FIG. 8A and completes the cycling of the device of the array.

Reference is now made to FIG. 8E which illustrates the condition of the cells of a device in a column being addressed for read out but in a row other than the row which is being read out. Note that the charge which for convenience is shown as maximum stored charge Q is retained in the row-oriented cell while the column-oriented cell voltage is reduced to zero. Thus any device that is "half-selected" does not yield any charge upon raising the voltage of the column-oriented plate to zero. It should be noted that fast surface state charge is injected; however, it is small in comparison to stored charge and is not variable with photon generated charge rates.

Reference is now made to FIGS. 9A–9D which represent stages in the cycle of a device 81 in accordance with the present invention corresponding exactly to the stages represented respectively by FIGS. 8A–8D with certain modifications which improve the performance of the device. The third predetermined voltage to which the row-oriented plate 91 is changed to transfer charge from the row-oriented to the column-oriented cell and to which the column-oriented plate 92 is changed to cause injection of charge is now set at −5 volts which is above the threshold voltage of the cells. Operating the cells of the array above threshold voltage provides good conductivity between the cells for charge transfer between them. The existence of an inversion layer of minority carrier charge at this voltage avoids any problems created by non-uniformity of the threshold voltages of the devices of the array of which they are a part and also avoids injection of charge filling the fast surface states in the devices when in the half select condition represented in FIG. 9E. This possibility has been pointed out in connection with FIG. 8E. To provide the same charge storage capacity in the device of FIGS. 9A–9D as in device of FIGS. 8A–8D the row-oriented plate voltage is set at −25 and the column oriented plate voltage is set at −15.

The cycling of the device 81 of FIGS. 9A–9D is similar to the cycling of the device under the operating conditions of FIGS. 8A–8D. FIG. 9A represents the start of a cycle of operation of the device, i.e., the instant of return of both the column-oriented plate 92 and row-oriented plate 91 of the device 81 to their storage potentials. Charge Q′, referred to as iterative charge and shown stored in the composite potential well 110 under the row-oriented plate 91, originates as a consequence of changing of the voltage on the column-oriented and row-oriented plates to a voltage other than zero to effect injection of stored charge and its origin will be clear from the explanation of the cycling of the device 91. The component of charge Q′ is shown in the potential wells for purposes of identification and explanation by cross-hatching directed in quadrature to the cross-hatching of photon generated charge Q. At the start of the cycle the potential at the surface portions of the substrate 85 underlying the column-oriented plate 92 and row-oriented plate 91 is −15 volts indicated by level 111. FIG. 9B shows maximum photon generated charge Q stored in the device and the iterative charge Q′ producing a surface potential of −10 volts indicated by level 112. Preparatory to injection of the photon generated charge Q the potential on the row-oriented plate 91 is changed to −5 volts and produces the distribution of charge in the potential wells underlying the plates as shown in FIG. 9C. Next, the potential on the column-oriented plate 92 is changed to −5 volts, which cases charge beyond what the −5 volt potential wells underlying the plates can hold, represented photon generated charge Q, to be injected into the substrate as shown in FIG. 9D. In the operation of the device in an array the iterative charge Q′ woud accumulate over the first few cycles of operation. The accumulation and existence of such charge is essential for the mode of operation represented in FIGS. 9A–9D with resultant advantages thereof pointed out above. After the stored charge Q has been injected and has disappeared from the region of depletion of the column-oriented cell the plate 92 thereof is lowered to −15 volts to produce a potential well such as shown in FIG. 9C without the photon generated component of charge Q. After completion of the scanning of the row, the row-oriented plate 91 is returned to −25 volts to form the composite potential well with iterative charge Q′ therein shown in FIG. 9A and completes the cycling of the device of the array. It should be noted that charge is being stored while the device 81 is in the various conditions of selection for read out and return from such condition to the condition represented by FIG. 9A.

Reference is now made to FIG. 9E which illustrates the conditions of the cells of a device 81 in a column being addressed for read out but in a row other than the row which is being read out. Note that maximum photon generated charge Q and the iterative charge Q′ fill the potential well underlying the row-oriented plate 91 to the extent of producing a surface potential of −5 volts equalling the surface potential underlying column-oriented plate 92. Accordingly, injection of surface state charge noted in connection with FIG. 8E is avoided and in addition a margin of safety is provided for undesired spill over of charge accumulated in the potential wells and hence undesired charge injection.

Reference is now made to FIGS. 10A–10D which represent stages in the cycling of a device 81 in accordance with the present invention corresponding exactly to the stages represented respectively by FIGS. 9A–9D with certain modifications to double the charge storage capacity thereof. The storage voltage applied to the column-oriented plate 92 is made identical to the storage voltage applied to the row-oriented plate 91. Accordingly charge is stored in the potential wells underlying both of the plates. The use of −5 volts on the row-oriented plate 91 and column-oriented plate 92 to effect charge transfer and injection assures good conductivity in the substrate under both of the plates and hence enables charge to be transferred between cells readily for read out, as illustrated in FIG. 10D, and to avoid injection under the half select condition, as illustrated in FIG. 10E. Iterative charge Q′ occurs for reasons indicated in connection with FIGS. 9A–9D. The iterative charge Q′ is stored in the composite potential well 114 underlying both plates as shown at level 115 in FIG. 10A. FIG. 10B shows the photon generated charge Q along with iterative charge Q′ stored in the composite potential well underlying both plates and thereby raising the surface potential to level 116. FIG. 10C shows the preparation of the device for read out by a change in the potential of the row-oriented plate 91 to the transfer potential of −5 volts. Note the iterative charge Q′ and photon generated charge Q completely fill the resultant composite well 117. A change in the voltage on the column-oriented plate 92 to injection potential of −5 volts effects injection of photon generated charge Q and retention of iterative charge Q′. FIG. 10E shows the charge storage condition of a "half selected" device 81 when containing maximum photon generated charge.

In the modes of operation described in connection with FIGS. 8A–8E, 9A–9E, and 10A–10E, the charge transfer potential on the row-oriented plate 91 is the same as the charge injection potential used on the column-oriented plates 92. The devices will operate as well when the transfer potential and the injection potential are different, however, under such condition the maximum charge storable is reduced. The potential to which the row-oriented plate 91 is returned when it is other than the same potential to which the column-oriented plate is changed may conveniently be referred to as the fifth potential.

Referring now to FIG. 11, there is shown a block diagram of a system including thhe image sensing array 80 of FIG. 4 to provide a video signal in response to radiation imaged on the array by a lens system (now shown), for example. Also connected into the system is a display device 120 such as a cathode ray tube, for converting the video signal into a visual display of the image.

Figures 12H, 12I, 12J, 12K, 12L, 12M, 12N, 12O:
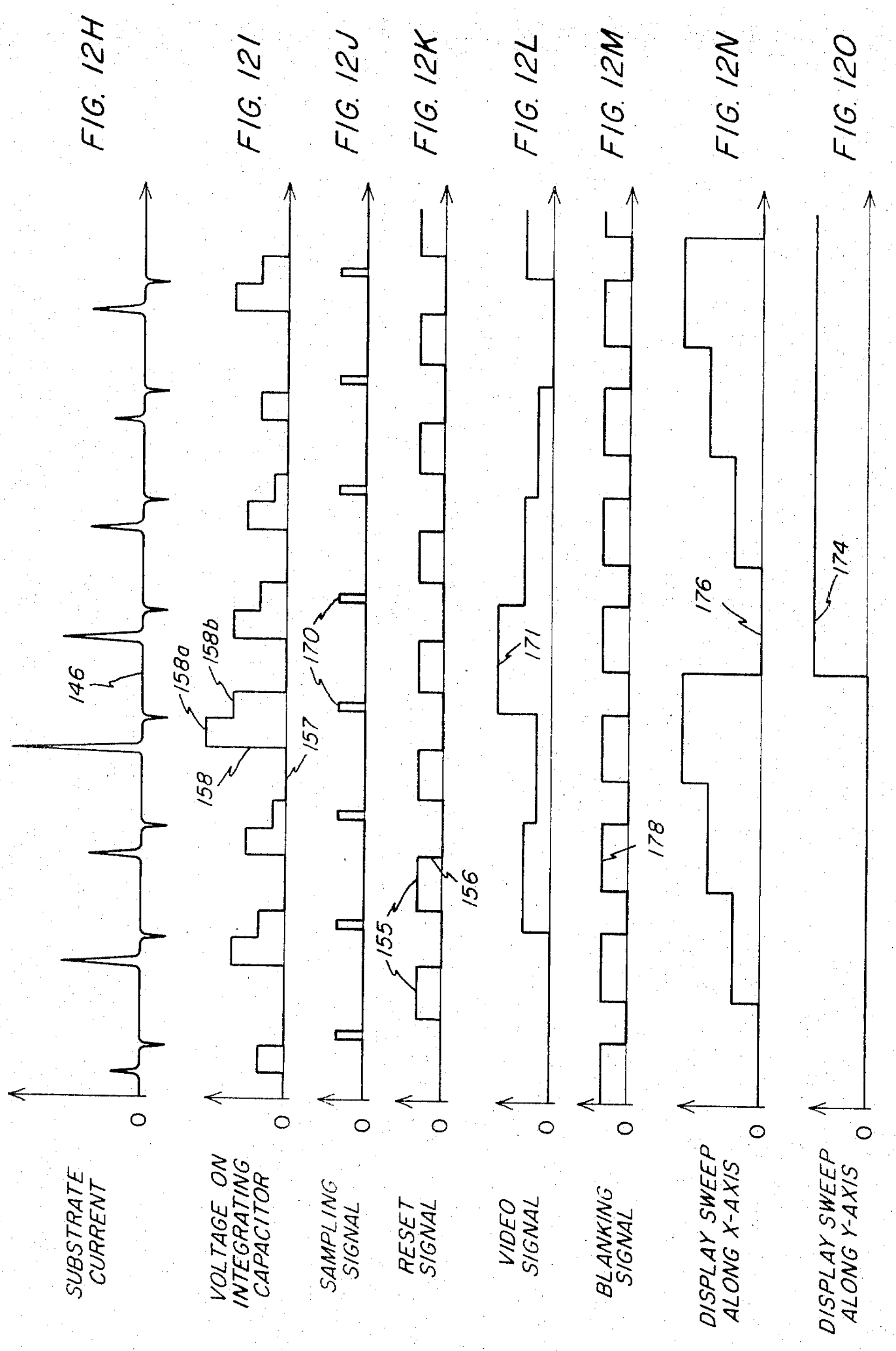

The system will be described in connection with FIGS. 12A–120 which show diagrams of amplitude versus time drawn to a common time scale of signals occurring at various points in the system of FIG. 11. The place of occurrence of a signal of FIGS. 12A–120 is referenced in FIG. 11 by a literal designation corresponding to the literal designation of the figure reference. The amplitudes of the signals of FIGS. 12A–12O are not drawn to a common voltage or current scale for reasons of clarity in explaining the operation of the system in accordance with the present invention. The mode of operation for the devices of the array of FIG. 11 is the mode of operation described in connection with FIGS. 9A–9E.

The system includes a clock pulse generator 121 which develops a series of regularly occurring pulses of short duration utilized for timing the image sensing subsystem and the display sub-system therefor. The output of the pulse generator 121 is shown in FIG. 12A which depicts pulses 122 occurring in sequence at instants of time $t_1$–$t_8$ and representing a half scanning cycle of operation of the array. The output of the clock pulse generator is applied to a first counter 123 which divides the count of the clock pulse generator by four. The output of the first counter 123 is also applied to a second counter 124 which further divides the count applied to it by four.

The output of the second counter 124 is applied to the row line decoder and driver 125 which develops four outputs during a cycle of operation, each of which is applied to a respective one of row conductor lines $X_1$–$X_4$ of the array, only the first and second outputs of which are shown in the graphs of FIGS. 12B and 12C. The first output 126 shown in FIG. 12B is applied to row conductor line $X_1$ and the second output 127 shown in FIG. 12C is applied to row conductor line $X_2$. The first output rises from −25 volts to −5 volts where it remains until time $t_4$ when it drops to −25 volts where it remains during the remainder of the cycle. At time $t_4$ the second output rises from −25 volts to −5 volts where it remains until time $t_8$ after which it drops to −5 volts and remains there for the duration of the cycle of scan. Similarly, at time $t_8$ the third output (not shown) rises from −25 volts where it remains until time of occurrence of the twelfth pulse of the clock generator when it drops to −25 volts where it remains. Finally, during the time between the 12th and 16th pulses from the clock generator the fourth output (now shown) has a value of −5 volts and has a value of −25 during thhe remainder of the cycle of scan. As each of the lines $X_1$–$X_4$ is connected through a respective one of isolating resistor 131–134 to a −25 V potential point with respect to ground provided by source 130, the outputs applied thereto from the row line decoder and driver 125 causes a rise in potential on each of the lines $X_1$–$X_4$ in sequence from −25 volts to −5 volts. As pointed out above in connection with FIGS. 9A–9E raising of the potential of a row conductor line raises the potential of the row-oriented plates 91 of the devices 81 connected thereto and enables read out of the devices by application of readout potentials to column-oriented plates 92 in turn.

The output of the clock pulse generator 121 is also applied to the timing and control circuits block 135 which provides a plurality of outputs for the system. The column line decoder and driver 136 receives an input from the timing and control circuits block 135 and inputs from the first counter 123 to provide four outputs 137–140 shown respectively in FIGS. 12D–12G, each corresponding to a respective one of clock pulses occurring at instants $t_1$–$t_4$. Each of the outputs is applied to a respective one of column conductor lines $Y_1$–$Y_4$ 137–140 having respective pulse portions 137′–140′. Each of the outputs rise from a −15 volt level to a −5 volt level where it remains for an interval of time and thereafter returns to the '15 volt. As each of the lines $Y_1$–$Y_4$ is connected through a respective one of isolating resistors 141–144 to a −15 volt potential point with respect to ground provided by source 145, the outputs applied thereto from the column line decoder and driver 136 causes a rise in potential on each of the lines $Y_1$–$Y_4$ in sequence from −15 volts to −5 volts. As pointed out above in connection with FIGS. 9A–9E raising of the potential of a column conductor line raises the potential of the column-oriented plates 92 of the devices 81 connected thereto and accordingly minority carriers stored in the device in the row selected for read out are injected into the substrate of the array. The interval at which the column conductor line is maintained at −5 volts is set to allow the injected carriers to disappear from the region of storage. Reestablishment of the −15 volt level sets the device up for another cycle of operation thereof.

The current flow in circuit with the substrate of the array through substrate contact 98 in response to a sequential scanning of the devices in the first and second rows of the array is depicted in the graph 146 of FIG. 12H. In this figure are shown eight pairs of current pulses corresponding respectively to the current flow in circuit with the substrate during the read out of the devices of the first and second rows in sequence. The first occurring pulse of each pair corresponds to current flow corresponding to read out of radiation produced charge and to some of the depletion producing charge stored at the instant of application of storage potential to the column-oriented plate 92 of the device. The second occurring pulse of opposite polarity to the first occurring pulse corresponds to the aforementioned current flow resulting from the application of voltage to the column-oriented plate 92 of the device. The first pulse of each pair occurs at the leading edge of a respective one of column drive pulse 137′–140′ and the second pulse of each pair occurs at the lagging edge of a respective one of drive pulses 137′–140′. The first pulses are shown of various amplitudes corresponding to various magnitudes of charge stored in the various devices of the first two rows. The amplitudes of the second pulses are identical as the column-oriented cells of each of the devices are identically constituted and hence would take identical charging or depletion region producing current. The important consideration in this connection is not variation in such charging currents among the cells but rather the difference in the charge flow into the substrate to establish the initial depletion and the charge which flows back out on injection of stored charge. As pointed out above at zero charge storage levels the difference is zero and increases progressively to maximum storage level. Such a condition produces a slight non-linearly in the response of the system. Integration of the first and second pulses of each pair of pulses is provided by charging a capacitor, for example, the voltage across the capacitor represents the charge stored in the sensing device 81 in the first-row and the first column. Such a function is provided by capacitor 150 connected between the substrate contact 98 and ground. The capacitor 150 represents essentially the capacitances of the substrate 85 of the array 80 in relation to the plates of the devices 81 other than the devices in the column undergoing read-out as explained in connection with FIG. 2D and includes stray capacitance such as capacitance of the array lead lines and contact tabs and may also includes capacitance, if desired. An N-channel field effect transistor 151 is provided having its source 153 to drain 152 circuit connected in shunt with the capacitor 150 and its gate 154 connected to the timing and control block 135 which provides reset pulses 155 as shown in FIG. 12K. The reset pulses 155 switch from a ground to a positive voltage level. The trailing edge 156 of each reset pulse is coincident with the leading edge of a respective one of column line drive pulses 137′–140′. Accordingly, except during the read out interval for each device 81 the capacitor 150 is shorted or bypassed to ground. On occurrence of a column drive pulse, a pair of current pulses as mentioned above are produced which are integrated by the capacitor 150 and result in a corresponding two level output pulse, the first level corresponding to the charge of the first current pulse and the second level corresponding to the charge of the first current pulse less the charge of the second current pulse. The output across the capacitor is shown in graph 157 FIG. 12 I in which each of the two leveled pulses 158 having a first level **158*a* and a second level 158*b* correspond respectively to a respective pair of pulses of FIG. 12H. In the case of the first pulse and seventh pulse of graph 157, the second level is zero indicating that no radiation produced charge had been stored in the devices corresponding thereto. The period of time conveniently referred to as the first predetermined period represents time during which radiation induced charge is being stored in a device and the period conveniently referred to as a second predetermined period represents time during which charge is being read out and corresponds to the interval of a column drive pulse. The third predetermined interval represents the time during which the reset switch is closed and the fourth predetermined interval represents the time during which the reset switch is open. As the same capacitor 150 and the same switch, transistor 151**, is used in the read out of charge stored in each of the devices, the array is ungrounded many times during the storage cycle of a device. As signal voltage amplitude is small in relation to storage potentials utilized on the plates such action does not affect the storage in the devices not undergoing read out.

The output appearing across the integrating capacitor 150 is applied to a video channel 160 comprising a first amplifier 161, a sample and hold circuit 162 and a second amplifier 163, the output of which is shown applied to the X axis or electron beam intensity modulation electrode of the cathode ray tube display device 120. The sample and hold circuit 162 includes an N-channel MOSFET transistor 164 having a drain 165, a source 166 and a gate 167 and a capacitor 168. The source to drain current flow path of the transistor 164 is connected between the output of the amplifier 161 and one electrode of the capacitor 168, the other electrode of which is connected to ground. The gate 167 is connected to the timing and control circuits block 135 which provides a train of sampling pulses 170 such as shown in the graph FIG. 12J. Each of the pulses 170 are of short duration and are equally spaced along the time axis of the graph. One sampling pulse 170 occurs for every clock pulse 122. Each of the pulses are phased to occur during the occurrence of the back porch or second level **158*b* of the two level video pulses 158 of FIG. 12 I appearing on the integrating capacitor 150. During the sampling intervals the transistor 164 is turned on so as to permit the second capacitor 168 to charge in turn to a voltage corresponding to the voltage of the second levels 158b of the pulses 158 of FIG. 12 I. Accordingly, a video signal 171 such as shown in FIG. 12L is provided in which the signal shifts from one video level to another at the sampling interval in accordance with the voltage on the integrating capacitor 150 during the sampling interval. As mentioned above, the video signal is amplified by the second amplifier 163 and applied to the intensity modulation electrode of the display device 120**.

Vertical deflection of the electron beam of the display device is provided by a step wave 174 of voltage only two steps of which are shown in FIG. 12O. Step wave 174 is formed from the output of the second counter 124 by means of a digital to analog converter 175. The digital to analog converter 175 connected to the output of the second counter 124 provides zero output during the first four pulses of a timing cycle and accordingly the electron beam is situated in its uppermost or first position along the Y-axis of the display device. Upon the occurrence of fourth timing pulse at time $t_4$ the voltage at the output of the digital to analog converter 175 shifts to a higher level corresponding to a coordinate on the Y axis of the display device which is displaced downward from the position to a second position and remains there during the next four clock pulses. Upon the occurrence of the timing pulse at time $t_8$ the electron beam is shifted downward to a third position and remains there until the end of the twelfth pulse clock pulse at which time the output from the digital to analog converter 175 shifts to its highest value and remains there until the end of the sixteenth pulse after which it returns to zero. During the fourth step in the voltage wave, the beam assumes its lowermost or fourth position on the Y-axis.

Sweep of the electron beam of the display device 120 along the X-axis or horizontal axis is provided by another step wave 176 such as shown in FIG. 12N. Voltage wave 176 is provided by the digital to analog converter 177 which is connected to the first counter 123 and cycles every four clock pulses and provides a series of steps of increasing amplitude at the instant a clock pulse occurs. Accordingly, while the beam is constrained to movement at a level along Y-axis by step wave 174, the beam is stepped along on the X axis to assume four positions, each successively farther displaced from the left hand edge of the display device. During the stepping of the Y-axis sweep voltage wave from one level to another level the X-axis sweep voltage wave returns to the left hand edge to repeat its cycle. Accordingly, starting at the upper left hand corner of the display, the electron beam is caused to switch successively from left to right along the X-axis to successively displaced positions along a row for each of the rows in succession. During the interval that the electron beam is switched from one position to another the electron beam is blanked by means of a blanking signal 178 such as shown in FIG. 12M. The blanking signal, FIG. 12M, is obtained from the timing and control circuit block 135 and occurs in timed relationship to the train of clock pulses from the clock pulse generator 121. During the horizontal scanning cycle, the electron beam of the display device 120 is switched off during the interval that the electron beam is switched from one horizontal position of the display device to the next adjacent position and remains off until after a corresponding sampling pulse 170 occurs. Thereafter the beam is turned on and remains on until the electron beam of the display device is switched to its next adjacent position. It should be noted that positive levels of the blanking signal produce blanking of the electron beam and zero levels of the blanking signal correspond to intervals during which the electron beam is on. While in the system of FIG. 11, one form of scanning and blanking for a display has been shown, it will be understood that other forms of sweep and blanking may be utilized for providing a display.

Reference is now made to FIGS. 13, 14 and 15 which show four sensing devices 180 of an image sensing array 181 of radiation sensing devices similar to the array 80 of FIGS. 4 through 7. The elements of the array 181 of FIGS. 13–15 identical to the elements of the array 80 of FIGS. 4–7 are identically designated. The array of FIGS. 13, 14 and 15 is formed in a manner similar to the manner in which the array of FIG. 4 is formed. However, in place of the P-type region 96 coupling the depletion regions of the cells of a device 81, overlapping of column-oriented plate 182 of device 181 with the row-oriented plate 183 thereof by means of extension 182' is provided to achieve close coupling between the depletion regions of the cells of the device 181. In place of the ring conductor 98 of FIGS. 4–7 a conductive film or plate 184 provides the electrical connection to the substrate 85. The process for the formation of the array of FIG. 13 is identical to the process for the formation of the array of FIGS. 4-7 except that the diffusion step has been eliminated. The row-oriented plate 183 of each of the devices are simultaneously formed along with the row conductor lines for connecting the row-oriented plates of a row. A layer of insulation 84 such as is then laid over the row-oriented plates and the conductor lines are put down. Thereafter the column-oriented plates 182 of each of the devices and the column conductor lines are simultaneously formed by vapor deposition of a metal such as aluminum thereon. The metallized layer is patterned so as to provide an overlap of portion of the row-oriented plate 183 of a device by the column oriented plate 182 thereof, as shown. In this process the layer of oxide between plate 182 and the substrate is thicker than layer 89 under plate 183. The storage capacity desired in the potential well under plate 182 is obtained by applying the appropriate storage potential thereto. In other respects the array of FIG. 13 is identical to the array of FIG. 4. The manner of operation of the array 181 in a system for providing a video signal in response to the received radiation is identical to the operation of the array of FIGS. 4-7 therein as described in connection with FIGS. 11 and 12A–12O.

Reference is now made to FIGS. 16 and 17 which show two devices 190 of an image sensing array 191 similar to the imaging sensing array of FIGS. 4–7 except that the P-type diffusion regions 96 have been eliminated. Close coupling of the depletion regions of a device is obtained by close spacing of the plate 91 and 92 thereof. Preferably, the plates 91 and 92 are spaced with adjacent edges 91*a* and 92*a* such that their depletion regions couple with the inversion layers of the cells of a device in engagement to obtain good conductivity therebetween as explained in connection with FIGS. 9A–9D and FIGS. 10A–10D. The elements of the array of FIGS. 16 and 17 are identically designated. The process for the formation of the array of FIGS. 16 and 17 is identical to the process for the formation of the array of FIGS. 4–7 except that the step for the formation of the diffused P-type region 96 between the plates of a device has been eliminated.

In place of the ring conductor 98 of FIGS. 4–7 a conductive film or plate 194 provides the electrical connection to the substrate 85. In other respects the device and the formation thereof is identical to the device of FIG. 4. The operation of the device of FIGS. 16 and 17 is identical to the operation of the device of FIG. 4 in a system such as described in connection with FIG. 11.

Referring now to FIG. 18, there is shown a block diagram of the array 80 of FIG. 4 and also of FIG. 11 for use in a system such as described in connection with FIG. 11 in which the drive circuits for the row conductor lines $X_1$–$X_4$ and for the column conductor lines $Y_1$–$Y_4$ are incorporated in the substrate 207 of the assembly 200 to minimize the number of external connections which are required to be made for utilizing the array 80 in a system. Substrate 207 is of larger area than substrate 85 of FIG. 4 in order to permit incorporation of the additional circuits thereon, otherwise it is identical to substrate 85.

The system will be described in connection with FIGS. 19A–19H which show diagrams of amplitude versus time drawn to a common time scale for signals occurring at various points in the assembly 200 of FIG. 18 when connected in a system such as shown in FIG. 11 in a manner to be described. The point of occurrence of a signal of FIGS. 19A–19H is referenced in FIG. 18 by a literal designation corresponding to the literal designation of the figure reference. The mode of operation for the devices of the array of FIG. 18 is the mode of operation described in connection with FIGS. 10A–10E. However, in the devices of FIG. 18 the maximum storage voltage applied to the devices is −15 volts instead of the −25 volts shown in connection with FIGS. 10A–10E. The image sensing array 80 is identical to the image sensing array of FIG. 11 and includes row conductor lines $X_1$ thru $X_4$ and column conductor lines $Y_1$ thru $Y_4$. A plurality of row line isolating resistors 201–204 are provided each having one end thereof connected to a respective one of the row conductor lines $X_1$–$X_4$ and each having the other end thereof connected to a row line bias terminal 205, which in a system is connected to the negative terminal of a −15 volt source 206 and is so indicated by a dotted line. The positive terminal of the source 206 is connected to ground. Similarly, a plurality of column line isolating resistors 211–214 are provided on the substrate each having one end connected to a respective one of column conductor lines $Y_1$–$Y_4$ and each having the other end thereof connected to a column line bias terminal 215 in a system which is connected to the negative terminal of a −15 volt source 216 and is so indicated by a dotted line. The positive terminal our the source 216 is connected to ground. The resistors 201–204 and 211–214 may be formed by a variety of techniques. In one form known to the art each of the resistors may be constituted of a MOSFET transistor appropriately proportioned and biased to provide the desired resistance. Gating of the row conductor lines $X_1$–$X_4$ is provided by a plurality of MOSFET transistors 221–224 formed integrally on the substrate 207, each having a drain electrode connected to a respective one of the row conductor lines $X_1$–$X_4$ and each having a source electrode connected to a column line biasing contact 225 which in the operation in a system is connected to ground and is so indicated by a dotted line. Each of the gate electrodes of the transistors 221–224 is driven by a respective drive signal derived from the row shift register 226. The row shift register 226 may be any of a number of shift registers known to the art. The elements of the shift register 226 may be concurrently formed on the substrate at the same time that the devices of the imaging sensing array 80 are formed.

Figure 19A:
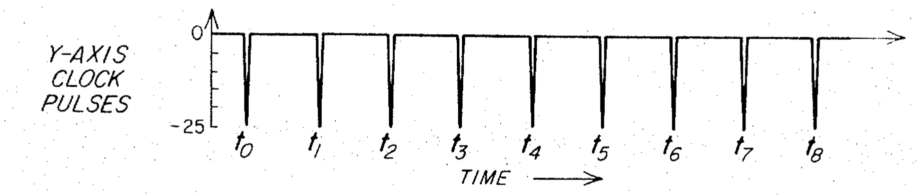
Figure 19B:
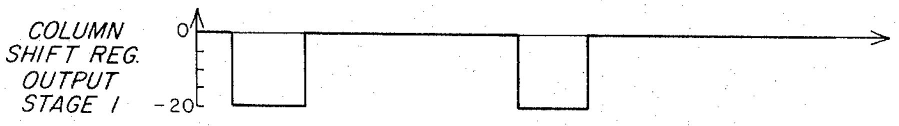
Figure 19C:
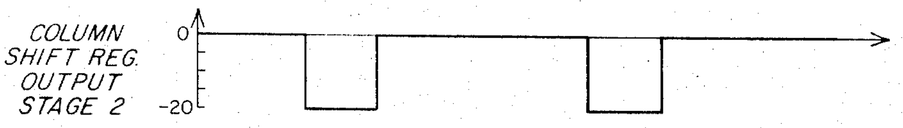
Figure 19D:
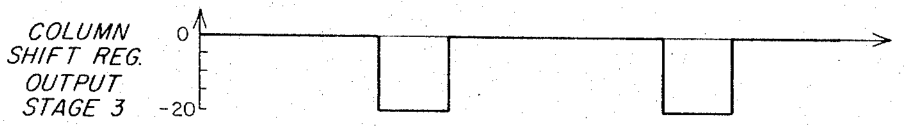
Figure 19E:
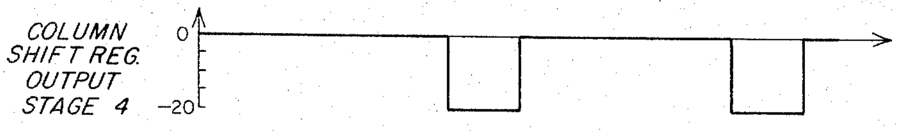
Figure 19F:
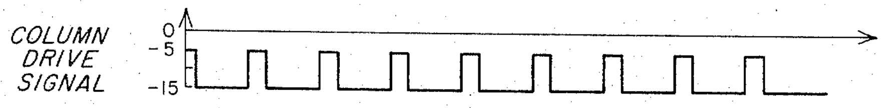
Figure 19G:
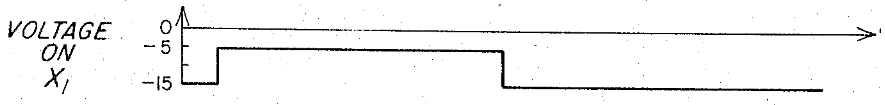
Figure 19H:
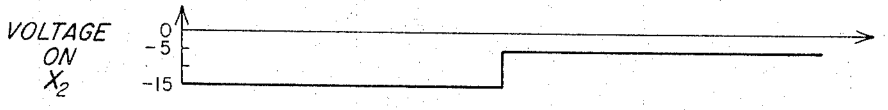

The shift register 226 is provided with a terminal 227 to which a train of vertical scanning rate clock pulses, which have a period corresponding to the sum of the periods of four Y-axis clock pulses, are applied. The vertical scanning rate or X-axis clock pulses may be derived from the output of a counter such as the first counter 123 of FIG. 11. Frame synchronizing pulses may be derived from counter 123 and are applied to frame synchronizing contact 229. Each of the frame synchronizing pulses has a duration equal to the sum of the periods o four Y-axis clock pulses. The frame synchronizing pulses are shifted in the shift register 226 at the X-axis clock rate to cause successive energization of the gate electrodes of the transistors 221–224 connected, respectively, to the lines $X_1$ thru $X_4$ to successively shift the voltage from a −15 volt value to a −5 volt value. The wave form of the drive voltage on $X_1$ is shown in FIG. 19G and the wave form of drive voltage on line $X_2$ is shown in FIG. 19H for one-half of a cycle of operation of the array.

Also integrally formed on the substrate 207 are a plurality of column conductor line drive MOSFET transistors 231–234. Each of the transistors 231–234 has a drain electrode connected to a respective column conductor line and each has a source electrode connected to a contact terminal 235 to which column drive signals are applied. Each of the gate electrodes of the transistors 231–234 is connected to a respective point on the column shift register 236. The column shift register 236 is provided with a input contact terminal 237 to which Y-axis clocking pulses are applied. Such pulses may be derived from a clock pulse generator such as clock pulse generator 121 of FIG. 11. The column shift register 236 is also provided with a horizontal line synchronizing contact 238 to which an input pulse is applied. The input pulse is shifted in the column shift register in response to the Y-axis clocking pulses. The wave form 241 of the pulse applied to the line synchronizing contact 238 is shown in FIG. 19B. As shown, the line synchronizing pulse has a width corresponding to the interval between a pair of Y-axis clocking pulses 228. At output terminal points of the column shift register 236 drive signals 241–244 shown respectively in FIGS. 19B–19E are obtained and are applied respectively to transistors 231–234. The drive signals have −20 volts amplitude for the interval indicated. Concurrently, a train of column drive pulses 245 shown in FIG. 19F which may be derived from a timing and control circuit block such as block 135, shown in FIG. 11, are applied to terminal 235. Each of the pulses 245 are of short duration corresponding to the time during which it is desired to read out the radiation produced charge stored in a device in a respective column. Such pulses cause injection of stored charge which would be sensed across an integrating capacitor such as capacitor 150 in FIG. 11 which would be connected between substrate contact 248 and ground in the sensing system. The pulses 245 are 10 volts in amplitude between the −15 and −5 volt levels. Accordingly, during the time interval from $t_o$ to $t_1$ the radiation sensing device 81 in the uppermost row and the column at the left of the array 80 is read out followed by the column corresponding to conductor line $Y_2$ etc.

MOSFET transistors in the assembly 200 may be formed in a manner similar to the manner in which the devices of the array 80 are formed and concurrently therewith. Similarly, the column shift register may be constituted of MOSFET transistors formed in a manner similar to the manner in which the devices of the array 80 are formed.

Power to the column shift register 236 and to the row shift register 226 are provided by power supply contacts 246 and 247 respectively. The contact 248 provides connection to the substrate and corresponds to contact 98 of FIG. 11. The operation of the system including the assembly 200 with array 80 therein is identical to the operation of the system shown and described in connection with FIG. 11 except as indicated above. Accordingly, in FIG. 18 a self scanned array assembly is provided in which a minimum of contacts are required to connect the array assembly in a system regardless of the number of row conductor lines and column conductor lines utilized and regardless of the size of the array.

While in connection with the systems described in connection with FIGS. 11 and 18, scanning systems have been provided in which the scanning of the row conductor lines occurs on a sequential basis and in which the scanning of the column conductor lines occurs on a sequential basis, it will be understood that scanning of the row lines and the column lines on a basis other than a sequential basis, for example, a random basis may be as well utilized.

While the invention has been described in connection with arrays of 16 devices, it is readily apparent that arrays including devices many orders of magnitude greater than 16 in number can be constructed in accordance with the invention. Also, the devices of the array may be organized in arrangements other than shown.

While in the illustrative embodiments described, the semiconductor substrate is constituted of silicon semiconductor material other semiconductor materials such as germanium and Group III-Group V compounds, such as indium arsenide and indium antimonide, could be used. Also, while in the illustrative embodiments described the insulating member was constituted of silicon dioxide, other insulating materials such as silicon nitride, silicon oxynitride, and aluminum oxide would be suitable. Also, the conductive plates could be constituted of any of a number of conductive materials, metallic and non-metallic.

While the arrays of the embodiments has been described as constituted of an N-type conductivity semiconductor material, P-type conductivity semiconductor material could as well be used. Of course, in such a case the applied potentials would be reversed in polarity and the current flows would be reversed in direction.

In front face illumination of the array the conductive plates are preferably transparent to provide high efficiency and sensitivity. Transparency in the conductive plates may be obtained by use of transparent metal layers or transparent high conductivity semiconductor materials, such as heavily doped silicon, or other materials which are both conductive and transparent, particularly in thin layers. In rear face illumination of the array the thickness of the substrate is preferably reduced to increase the efficiency and sensitivity of the array.

It is also apparent that while the invention has been described in connection with radiation sensing it is equally applicable to sensing energetic particles, such as electrons. In such application, the energetic particles would preferably be received at the rear surface or face of the substrate, i.e., the face opposite the face on which the insulating member and conducting members are located.

While the invention has been described in specific embodiments, it will be appreciated that modifications, such as those described above, may be made by those skilled in the art and it is intended by the appended claims to cover all such modifications and changes as fall within the true spirit and scope of the invention.

What I claim as new and desire to secure by Letters Patent of the United States is:

1. Apparatus for sensing radiation and providing an electrical output comprising a substrate of semiconductor material of one conductivity type, an insulating member overlying a major surface of said substrate, a conducting member overlying a surface of said insulating member, a first terminal connected to said conducting member, a second terminal, and a third terminal connected to said substrate, capacitive means connected between said third and second terminals, circuit means connected between said first and second terminals for establishing a first potential at said first terminal and means for establishing a second potential at said second terminal, the difference in said first and second potentials being of a polarity and a magnitude to produce depletion of majority carriers in a region in the surface adjacent portion of said substrate underlying said conducting member, upon application of said potentials thereto, means for exposing said substrate to radiation for a period of time whereby minority carriers generated in said region and in the vicinity thereof in proportional response to the time integral of the intensity of radiation incident therein are stored in a surface adjacent layer of said region producing an inversion in conductivity thereof, circuit means for changing the potential of said first terminal to a third potential to inject minority carriers stored in said inversion layer into said substrate whereby a current flows in circuit with said substrate into said capacitive means producing a change in voltage between said second and third terminals, said change in voltage being substantially proportional to said minority carriers stored in said depletion region during said first period.

2. The combination of claim 1 in which said first terminal is returned to said first potential after a second period of time to produce a current flow in a circuit with said substrate and said capacitive means which reestablishes depletion in said region, said current flow producing a net change in voltage between said second and third terminals which is substantially proportional to the minority carriers stored in said region during said first period.

3. The combination of claim 2 in which said second period is short in relation to said first period.

4. The combination of claim 2 in which the duration of said second period is sufficiently long that charge carriers injected into said substrate during the change in potential of said conducting member from said first potential to said third potential and returned have substantially disappeared from the portion of said substrate encompassed by said region.

5. The combination of claim 1 in which said first period is short enough in respect to the radiation being sensed that the minority carriers generated by the radiation are insufficient to charge said region to its maximum capacity to store charge.

6. The combination of claim 2 in which is provided switching means for connecting said third terminal to said second terminal for a third period and for disconnecting said third terminal from said second terminal for a fourth period, said fourth period spanning said second period.

7. The combination of claim 6 in which said switching means is operated repetitively to connect and disconnect said second and third terminals and in which the potential on said first terminal is repetitively changed from said first potential to said third potential and returned, and in which is included means for periodically sampling the voltage on said capacitive means during said fourth period and provide an electrical output varying in time in accordance with the variation in amplitude of the samples.

8. The combination of claim 2 in which said capacitive means includes a plurality of cells each including a part of said substrate of semiconductor material of one conductivity type, a part of said insulating member and a respective conducting member overlying said surface of said insulating member, and in which the conducting members of said plurality of cells are connected in circuit with said first terminal.

9. The combination of claim 2 in which said third potential is intermediate to said first and second potentials.

10. The combination of claim 2 in which said third potential is greater in absolute magnitude than the absolute magnitude of said second potential by the absolute magnitude of the threshold voltage of the structure including said substrate, said insulating member, and said conducting member.

11. The combination of claim 1 in which the capacitance of said conducting member in relation to said substrate is large in comparison to the capacitance of said region from which majority carriers are depleted immediately upon application of said first potential thereto.

12. The combination of claim 1 in which the structure including said substrate, said insulating member and said conducting member has a predetermined threshold voltage and in which the difference in potential in said first and second potentials exceeds said threshold voltage.

13. The combination of claim 1 in which the capacitance of said capacitive means is large in relation to the capacitance of said conducting member in relation to said substrate.

14. The combination of claim 1 in which said semiconductor material is silicon, said insulating member is silicon dioxide and said conducting member is a metal.

15. The combination of claim 1 in which said semiconductor material is silicon, said insulating member is silicon dioxide and said conducting member is a conductive layer of silicon.

16. In combination, a substrate of semiconductor material of one conductivity type, an insulating member overlying a surface of said substrate, a plurality of spaced conducting members overlying a surface of said insulating member, a plurality of first terminals each connected to a respective one of said conducting members, a second terminal, and a third terminal connected to said substrate, means for establishing a first potential at said first terminals, means for establishing a second potential at said second terminal, the difference in potential between said first and second potentials being of a polarity and a magnitude to deplete a plurality of regions of majority carriers in the surface adjacent portion of said substrate, each region of depletion underlying a respective conducting member, means for periodically connecting said third terminal to said second terminal during a third period of time and disconnecting said third terminal from said second terminal during a fourth period of time whereby a potential is established on said third terminal substantially equal to the potential on said second terminal during the connection thereof.

means for exposing said substrate to radiation whereby minority carriers generated in each of said regions of depletion and in the vicinity thereof in proportional response to the radiation incident therein and are stored in a respective surface adjacent layer of said region producing an inversion in conductivity thereof, said first terminals being connected in turn to a third potential and back to said first potential during said fourth period to inject some of said carriers stored in a respective inversion layer into said substrate whereby a net current flows in circuit with said substrate into the capacitance provided by the other of said conducting members in relation to said substrate during said fourth period to produce a net voltage between said second and third terminals in proportional response to said injected charge.

means for sampling each of said net voltages between said second and third terminals in turn to provide a time varying electrical output in accordance with the variation in amplitude of said samples.

17. In combination, a substrate of semiconductor material of one conductivity type, means including an electrode in insulated relation to a surface of said substrate and connected in a circuit with said substrate, means for applying a voltage of a polarity and magnitude between said electrode and said substrate to deplete carriers of said one conductivity type from a region adjacent said surface of the substrate whereby an initial potential is established at said surface which lies between the potential at said electrode and the potential of the substrate, and carriers of opposite conductivity type thermally generated in said region at a rate determined by the temperature of the substrate move under the influence of the electric field in said region toward the surface thereof where they accumulate in a layer adjacent said surface and cause a change in potential of said surface in the direction of the potential of the substrate, the potential of said surface attaining over a first interval of time an equilibrium value fixed in relation to the potential of the substrate, means for exposing said region to radiation of sufficient intensity to generate carriers of opposite conductivity type therein at a rate greater than said one rate of thermal generation of carriers therein whereby the equilibrium potential of said surface is attained in a second interval of time shorter than said first interval of time, means for changing the potential of said surface in the direction of the potential of said sub-strate before the end of said first interval to change the absolute magnitude of the surface potential to an extent such that some of the charge stored in said layer is unsupportable by the electric-field thereat whereby said carriers of opposite conductivity type are injected into said substrate and a current is caused to flow in said circuit, capacitive means connected in circuit with said electrode and said substrate for integrating the current flow in said circuit in response to changing the potential of said surface.

18. The combination of claim 17 in which the interval of time from the application of said voltage to the changing of said voltage to inject carriers of opposite conductivity type stored in said region is substantially less than said first interval.

19. The combination of claim 17 in which the interval of time from the application of said voltage to the changing of said voltage to inject carriers of opposite conductivity type stored in said region is substantially less than said second interval.

20. The combination of claim 17 in which changing the potential of said surface is produced by changing the magnitude of said voltage to a value less than the initial value thereof and greater than the magnitude of the threshold voltage of said electrode in insulated relationship to said substrate.

21. The combination of claim 17 in which said change in potential of said surface is produced by reducing the magnitude of said voltage to zero.

22. The combination of claim 17 in which is provided means for returning the potential of said surface to its initial potential after a third interval of time from the instant of changing the potential of said surface, said third interval being of sufficient duration to allow said carriers of opposite type injected into said substrate to disappear from said region whereby a charging current flows in said circuit, and in which said means for sensing current flow includes means for integrating the charge flow in said circuit in response to the initial changing of the potential of said surface and to the returning of the potential of said surface to its initial potential whereby a net charge flow is obtained which is a measure of the radiation incident on said region from the instant of application of said voltage to the instant of changing said voltage to cause injection of said charge into said substrate.

23. The combination of claim 22 in which said integrating means is a capacitor connected in said circuit during said other interval, whereby a voltage is developed across said capacitor corresponding to said net flow of charge in said circuit.

24. A radiation sensing device comprising a substrate of semiconductor material of one conductivity type having a major surface, a conducting member overlying a portion of a region of said substrate adjacent said major surface and in insulating relationship therewith, a voltage means for providing a voltage between said conducting member and said substrate to deplete said portion of majority charge carriers, means for exposing said substrate to radiation whereby minority carriers generated in said portion are stored therein, means for collapsing said voltage whereby charge stored in said second portion is injected into said substrate, capacitive means in circuit with said substrate and said conductive member for integrating the charge injected into said substrate.

25. A radiation sensing device comprising a substrate of semiconductor material of one conductivity type having a major surface, a plurality of conducting members, each overlying a respective portion of a region of said substrate adjacent said major surface and in insulating relationship therewith, said voltage means providing a voltage between said conducting members and said substrate to deplete said portions of majority charge carriers, means for exposing said substrate to radiation whereby minority carriers generated in said portions are stored therein, means for collapsing and reestablishing said voltage on each of said conducting members in sequence whereby charge stored in each of said portions of said surface adjacent region is injected in turn into said substrate, capacitive means in circuit with said substrate and said conductive members for integrating in turn the charge injected into said substrate.

* * * * *